US012641777B2

(12) United States Patent (10) Patent No.: US 12,641,777 B2

Wu (45) Date of Patent: May 26, 2026

(54) MEMORY DEVICE WITH AIR GAP AND METHOD FOR PREPARING THE SAME

(71) Applicant: NANYA TECHNOLOGY CORPORATION, New Taipei City (TW)

(72) Inventor: Chun-Heng Wu, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 385 days.

(21) Appl. No.: 18/518,543

(22) Filed: Nov. 23, 2023

(65) Prior Publication Data

US 2025/0176167 A1 May 29, 2025

(51) Int. Cl.
*H10B 12/00* (2023.01)

(52) U.S. Cl.
CPC ........... *H10B 12/482* (2023.02); *H10B 12/02* (2023.02); *H10B 12/315* (2023.02)

(58) Field of Classification Search
CPC ..... H10B 12/02; H10B 12/315; H10B 12/485
See application file for complete search history.

(56) References Cited

U.S. PATENT DOCUMENTS

| | | | | |
|---|---|---|---|---|
| 2016/0276273 A1* | 9/2016 | Kwon | ................. | H10W 20/072 |
| 2023/0238276 A1* | 7/2023 | Chuang | ................ | H10B 12/482 |
| | | | | 257/296 |
| 2024/0334684 A1* | 10/2024 | Kim | ..................... | H10B 12/315 |
| 2024/0349491 A1* | 10/2024 | Lee | ...................... | H10B 12/488 |

* cited by examiner

*Primary Examiner* — Antonio B Crite
(74) *Attorney, Agent, or Firm* — Xuan Zhang

(57) ABSTRACT

A memory device includes a bit line structure disposed over a semiconductor substrate, and a lower capacitor contact disposed over the semiconductor substrate and adjacent to the bit line structure. The memory device also includes a first nitride spacer and a second nitride spacer disposed between the bit line structure and the lower capacitor contact. The memory device further includes a capacitor disposed over the first nitride spacer and the second nitride spacer. In addition, the memory device includes a first oxide liner and a second oxide liner disposed between the first nitride spacer and the second nitride spacer. An air gap is between the first oxide liner and the second oxide liner.

18 Claims, 21 Drawing Sheets

10

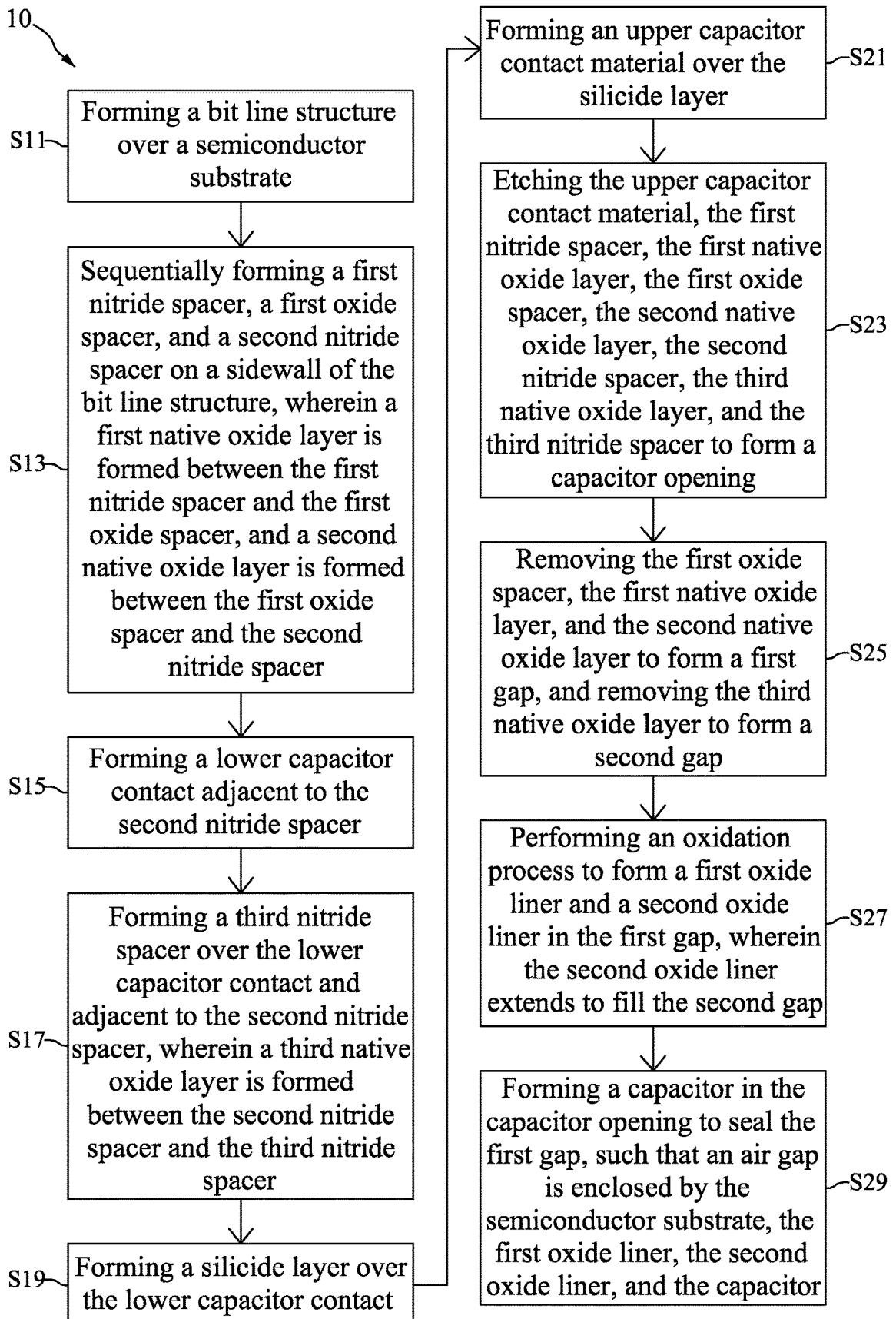

S11 — Forming a bit line structure over a semiconductor substrate

S13 — Sequentially forming a first nitride spacer, a first oxide spacer, and a second nitride spacer on a sidewall of the bit line structure, wherein a first native oxide layer is formed between the first nitride spacer and the first oxide spacer, and a second native oxide layer is formed between the first oxide spacer and the second nitride spacer S15 — Forming a lower capacitor contact adjacent to the second nitride spacer S17 — Forming a third nitride spacer over the lower capacitor contact and adjacent to the second nitride spacer, wherein a third native oxide layer is formed between the second nitride spacer and the third nitride spacer S19 — Forming a silicide layer over the lower capacitor contact S21 — Forming an upper capacitor contact material over the silicide layer S23 — Etching the upper capacitor contact material, the first nitride spacer, the first native oxide layer, the first oxide spacer, the second native oxide layer, the second nitride spacer, the third native oxide layer, and the third nitride spacer to form a capacitor opening S25 — Removing the first oxide spacer, the first native oxide layer, and the second native oxide layer to form a first gap, and removing the third native oxide layer to form a second gap S27 — Performing an oxidation process to form a first oxide liner and a second oxide liner in the first gap, wherein the second oxide liner extends to fill the second gap S29 — Forming a capacitor in the capacitor opening to seal the first gap, such that an air gap is enclosed by the semiconductor substrate, the first oxide liner, the second oxide liner, and the capacitor

FIG. 3

MEMORY DEVICE WITH AIR GAP AND METHOD FOR PREPARING THE SAME

TECHNICAL FIELD

The present disclosure relates to a memory device and a method for preparing the same, and more particularly, to a memory device with an air gap and a method for preparing the same.

DISCUSSION OF THE BACKGROUND

Due to structural simplicity, dynamic random access memories (DRAMs) can provide more memory cells per unit chip area than other types of memories, such as static random access memories (SRAMs). A DRAM is constituted by a plurality of DRAM cells, each of which includes a capacitor for storing information and a transistor coupled to the capacitor for regulating when the capacitor is charged or discharged. During a read operation, a word line (WL) is asserted, turning on the transistor. The enabled transistor allows the voltage across the capacitor to be read by a sense amplifier through a bit line (BL). During a write operation, the data to be written is provided on the BL while the WL is asserted.

To satisfy the demand for greater memory storage, the dimensions of the DRAM memory cells have continuously shrunk so that the packing densities of these DRAMs have increased considerably. However, the manufacturing and integration of memory devices involve many complicated steps and operations. Integration in memory devices becomes increasingly complicated. An increase in complexity of manufacturing and integration of the memory device may cause deficiencies. Accordingly, there is a continuous need to improve the structure and the manufacturing process of memory devices so that the deficiencies can be addressed, and the performance can be enhanced.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a memory device is provided. The memory device includes a bit line structure disposed over a semiconductor substrate, and a lower capacitor contact disposed over the semiconductor substrate and adjacent to the bit line structure. The memory device also includes a first nitride spacer and a second nitride spacer disposed between the bit line structure and the lower capacitor contact. The memory device further includes a capacitor disposed over the first nitride spacer and the second nitride spacer. In addition, the memory device includes a first oxide liner and a second oxide liner disposed between the first nitride spacer and the second nitride spacer. An air gap is between the first oxide liner and the second oxide liner.

In an embodiment, the first oxide liner is separated from the second oxide liner. In an embodiment, the air gap is enclosed by the semiconductor substrate, the first oxide liner, the second oxide liner, and the capacitor. In an embodiment, the first nitride spacer is separated from the air gap by the first oxide liner, and the second nitride spacer is separated from the air gap by the second oxide liner. In an embodiment, the first oxide liner is in direct contact with the first nitride spacer, and the second oxide liner is in direct contact with the second nitride spacer. In addition, the first oxide liner further extends between the first nitride spacer and the capacitor, and the second oxide liner further extends between the second nitride spacer and the capacitor.

In an embodiment, the memory device further includes an upper capacitor contact disposed over the lower capacitor contact, and a third nitride spacer disposed between the bit line structure and the upper capacitor contact, wherein the second nitride spacer is disposed between the first nitride spacer and the third nitride spacer, and the third nitride spacer is in direct contact with the upper capacitor contact. In an embodiment, the second oxide liner further extends between the second nitride spacer and the third nitride spacer. In an embodiment, the second oxide liner further extends between the third nitride spacer and the capacitor. In an embodiment, the second oxide liner further extends between the third nitride spacer and the lower capacitor contact. In an embodiment, the memory device further includes a silicide layer disposed between the lower capacitor contact and the upper capacitor contact, wherein the second oxide liner is in direct contact with the silicide layer.

In another embodiment of the present disclosure, a memory device is provided. The memory device includes a bit line structure and a lower capacitor contact disposed over a semiconductor substrate. The lower capacitor contact extends into the semiconductor substrate. The memory device also includes a first nitride spacer and a second nitride spacer disposed over the semiconductor substrate and between the bit line structure and the lower capacitor contact. The first nitride spacer is in direct contact with the bit line structure, and the second nitride spacer is in direct contact with the lower capacitor contact. The memory device further includes a first oxide liner and a second oxide liner disposed between the first nitride spacer and the second nitride spacer. The first oxide liner is in direct contact with the first nitride spacer, and the second oxide liner is in direct contact with the second nitride spacer. The first oxide liner is separated from the second oxide liner by an air gap.

In an embodiment, the first oxide liner and the second oxide liner are in direct contact with the semiconductor substrate. In an embodiment, the memory device further includes an upper capacitor contact disposed over the lower capacitor contact, and a third nitride spacer disposed between the second nitride spacer and the upper capacitor contact, wherein the third nitride spacer is in direct contact with the upper capacitor contact. In an embodiment, the third nitride spacer is separated from the second nitride spacer by the second oxide liner. In an embodiment, the memory device further includes a silicide layer disposed between the lower capacitor contact and the upper capacitor contact.

In an embodiment, the silicide layer is in direct contact with the third nitride spacer and the second oxide liner. In an embodiment, the memory device further includes a capacitor disposed over the first nitride spacer, the second nitride spacer, and the third nitride spacer, wherein the air gap is sealed by the capacitor. In an embodiment, the first oxide liner and the second oxide liner are in direct contact with the capacitor. In an embodiment, the first nitride spacer is separated from the capacitor by the first oxide liner. In an embodiment, the second nitride spacer and the third nitride spacer are separated from the capacitor by the second oxide liner.

In yet another embodiment of the present disclosure, a method for preparing a memory device is provided. The method includes forming a bit line structure over a semiconductor substrate, and forming a first nitride spacer, a second nitride spacer, and a first oxide spacer on a sidewall of the bit line structure. The first nitride spacer is in direct contact with the bit line structure, and the first oxide spacer is between the first nitride spacer and the second nitride spacer. The method also includes forming a lower capacitor contact adjacent to the second nitride spacer, and forming an upper capacitor contact material over the lower capacitor contact. The method further includes etching the upper capacitor contact material, the first nitride spacer, the second nitride spacer, and the first oxide spacer to form a capacitor opening, and removing the first oxide spacer through the capacitor opening to form a first gap between the first nitride spacer and the second nitride spacer. In addition, the method includes performing an oxidation process to form a first oxide liner and a second oxide liner in the first gap, and forming a capacitor in the capacitor opening to seal the first gap, such that an air gap is enclosed by the capacitor, the first oxide liner, the second oxide liner, and the semiconductor substrate.

In an embodiment, a top surface and a sidewall of the first nitride spacer are covered by the first oxide liner, and a top surface and a sidewall of the second nitride spacer are covered by the second oxide liner. In an embodiment, the method further includes forming a first native oxide layer between the first nitride spacer and the first oxide spacer, and forming a second native oxide layer between the second nitride spacer and the first oxide spacer, wherein the first native oxide layer and the second native oxide layer are etched to form the capacitor opening. In an embodiment, the method further includes removing the first native oxide layer and the second native oxide layer through the capacitor opening to form the first gap. In an embodiment, the method further includes forming a third nitride spacer over the lower capacitor contact and adjacent to the second nitride spacer before the upper capacitor contact material is formed.

In an embodiment, a top surface of the third nitride spacer is covered by the second oxide liner after the oxidation process is performed. In an embodiment, the method further includes forming a third native oxide layer between the second nitride spacer and the third nitride spacer before the upper capacitor contact material is formed, wherein the third nitride spacer is separated from the lower capacitor contact and the second nitride spacer by the third native oxide layer. In an embodiment, the method further includes removing the third native oxide layer to form a second gap, wherein the second gap is filled by the second oxide liner after the oxidation process is performed. In an embodiment, the method further includes forming a silicide layer over the lower capacitor contact after the third nitride spacer and the third native oxide layer are formed, wherein the upper capacitor contact material is formed over the silicide layer. In an embodiment, the silicide layer is in direct contact with the second oxide liner after the oxidation process is performed.

Embodiments of a memory device and method for preparing the same are provided in the disclosure. In some embodiments, the memory device includes a bit line structure and a lower capacitor contact disposed over a semiconductor substrate. The memory device also includes a first nitride spacer and a second nitride spacer disposed between the bit line structure and the lower capacitor contact. In some embodiments, the memory device includes a first oxide liner and a second oxide liner disposed between the first nitride spacer and the second nitride spacer, and an air gap is between the first oxide liner and the second oxide liner. The air gap may reduce parasitic capacitance and correspondingly improve device performance (e.g., by reducing signal noise). In addition, the first oxide liner and the second oxide liner help to prevent the first nitride spacer and the second nitride spacer from being etched through during the formation of the air gap. As a result, the short issue from the bit line structure to the lower capacitor contact can be prevented.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3 is a flow diagram illustrating a method for preparing a memory device, in accordance with some embodiments.

5

Figure 10:
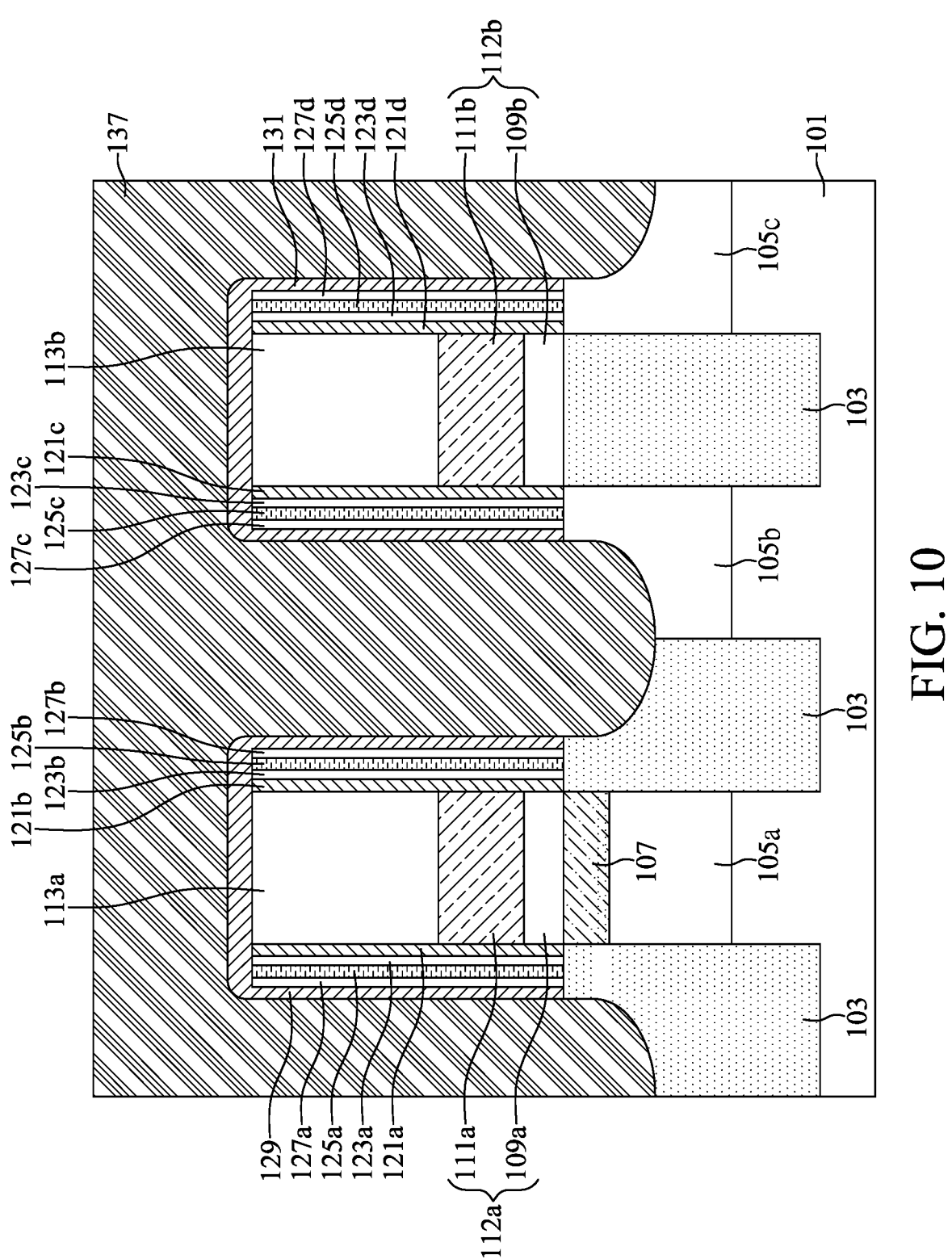

FIG. 10 is a cross-sectional view illustrating an intermediate stage of filling the openings with a lower capacitor contact material during the formation of the memory device, in accordance with some embodiments.

Figure 11:
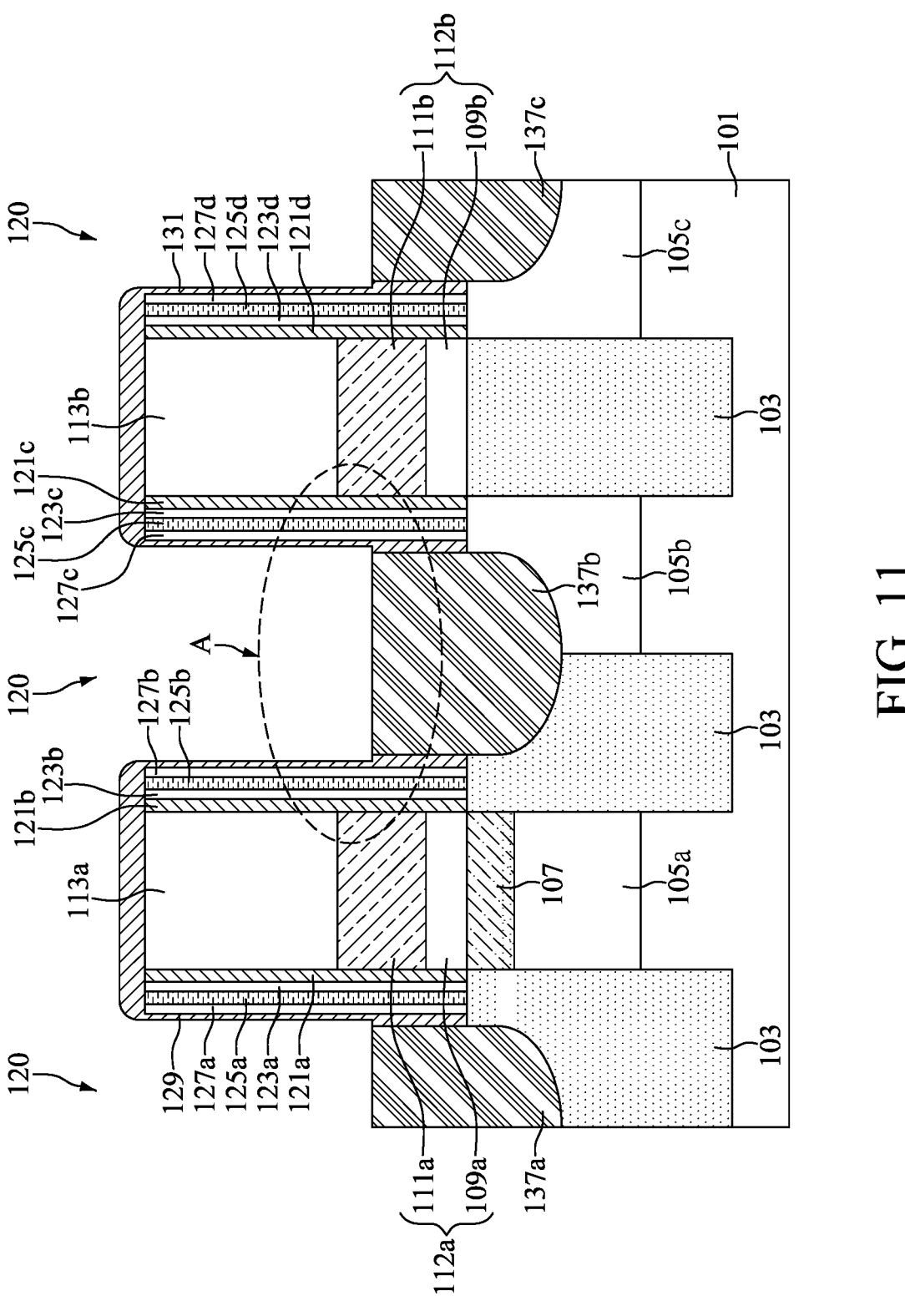

FIG. 11 is a cross-sectional view illustrating an intermediate stage of etching the lower capacitor contact material to form lower capacitor contacts during the formation of the memory device, in accordance with some embodiments.

Figure 12:
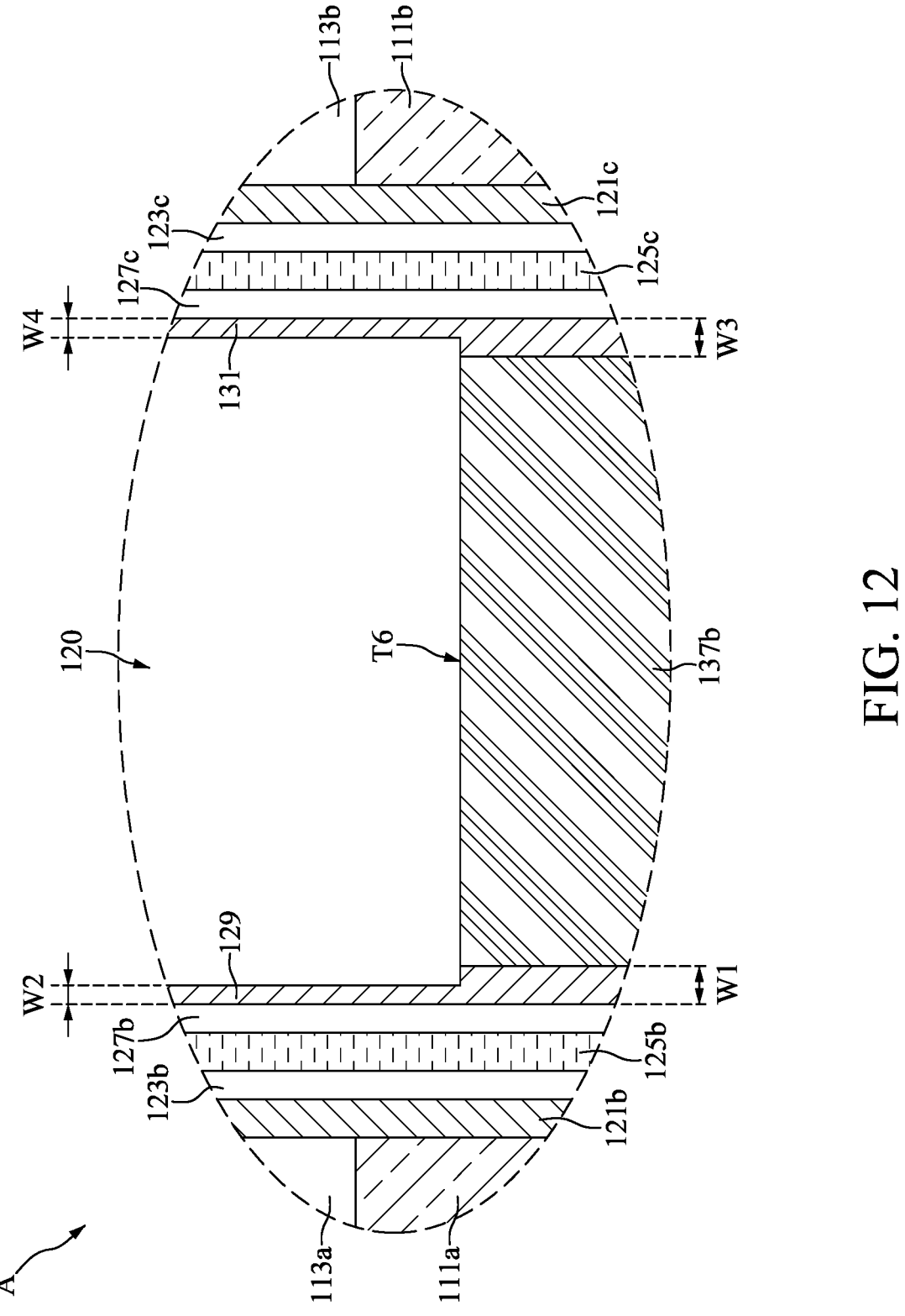

FIG. 12 is an enlarged view of region A in FIG. 11, in accordance with some embodiments.

Figure 13:
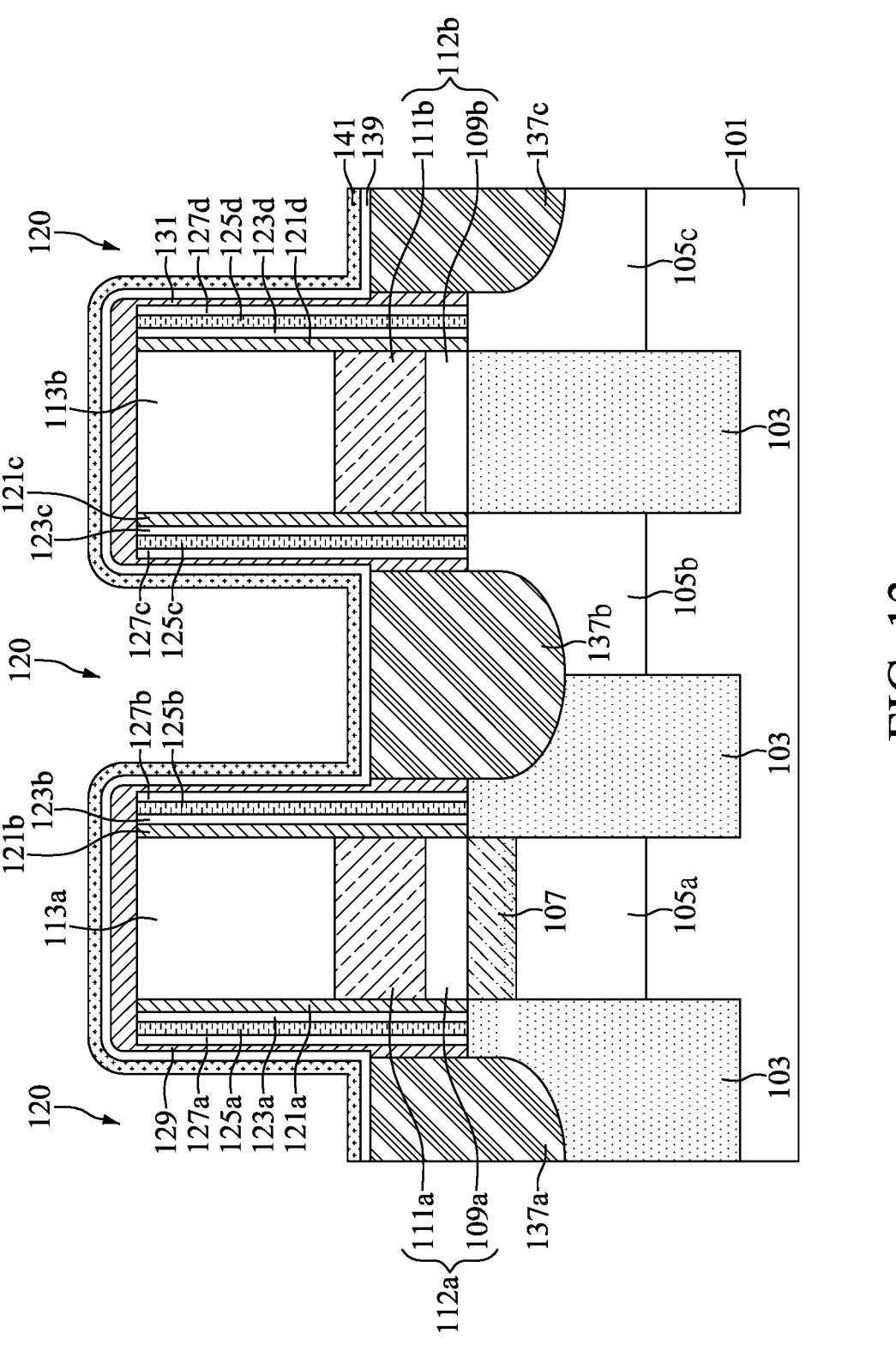

FIG. 13 is a cross-sectional view illustrating an intermediate stage of depositing a nitride spacer material over the bit line structures and the lower capacitor contacts during the formation of the memory device, in accordance with some embodiments.

Figure 14:
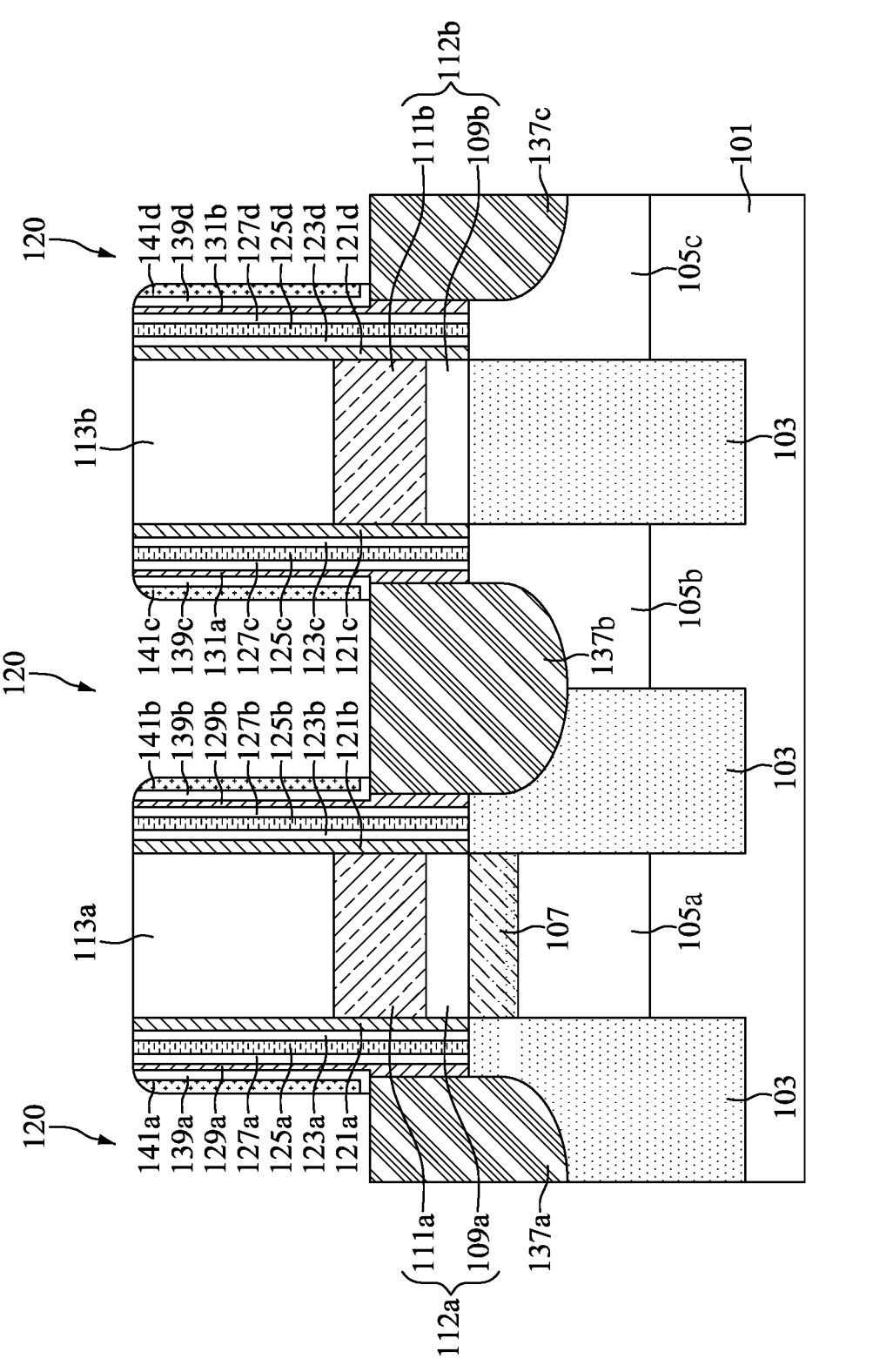

FIG. 14 is a cross-sectional view illustrating an intermediate stage of etching the nitride spacer material to form nitride spacers during the formation of the memory device, in accordance with some embodiments.

Figure 15:
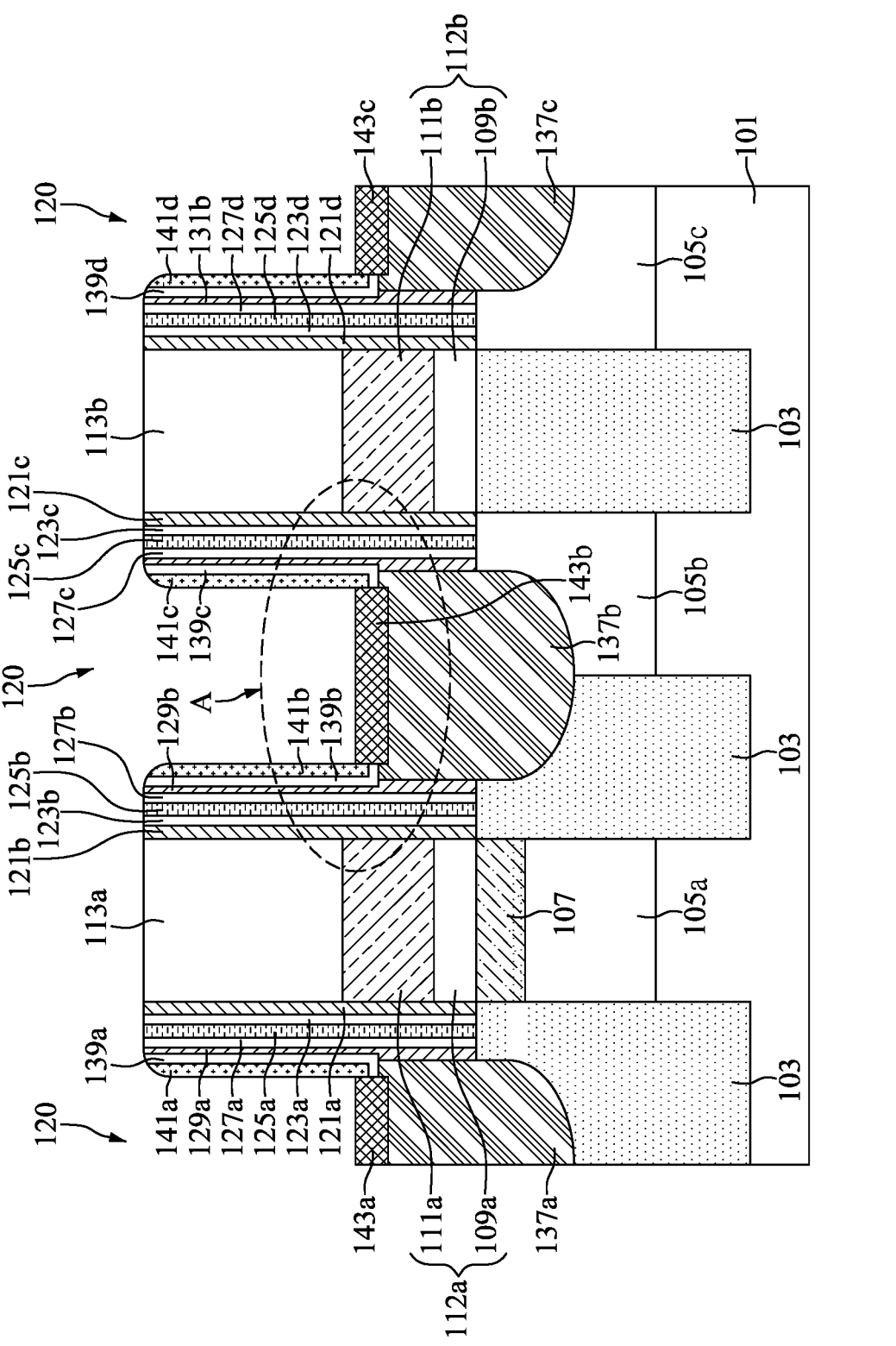

FIG. 15 is a cross-sectional view illustrating an intermediate stage of forming silicide layers over the lower capacitor contacts during the formation of the memory device, in accordance with some embodiments.

Figure 16:
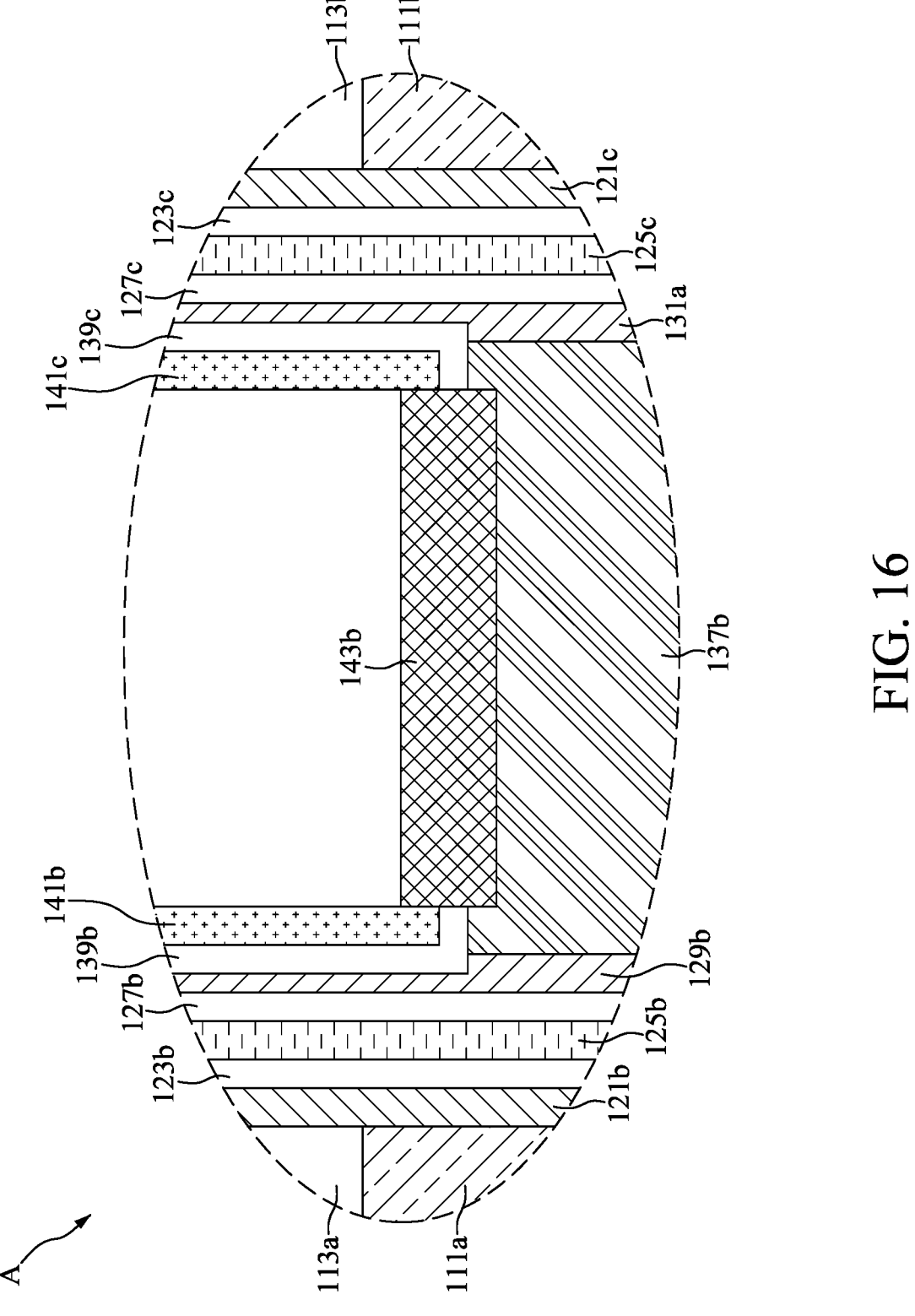

FIG. 16 is an enlarged view of region A in FIG. 15, in accordance with some embodiments.

Figure 17:
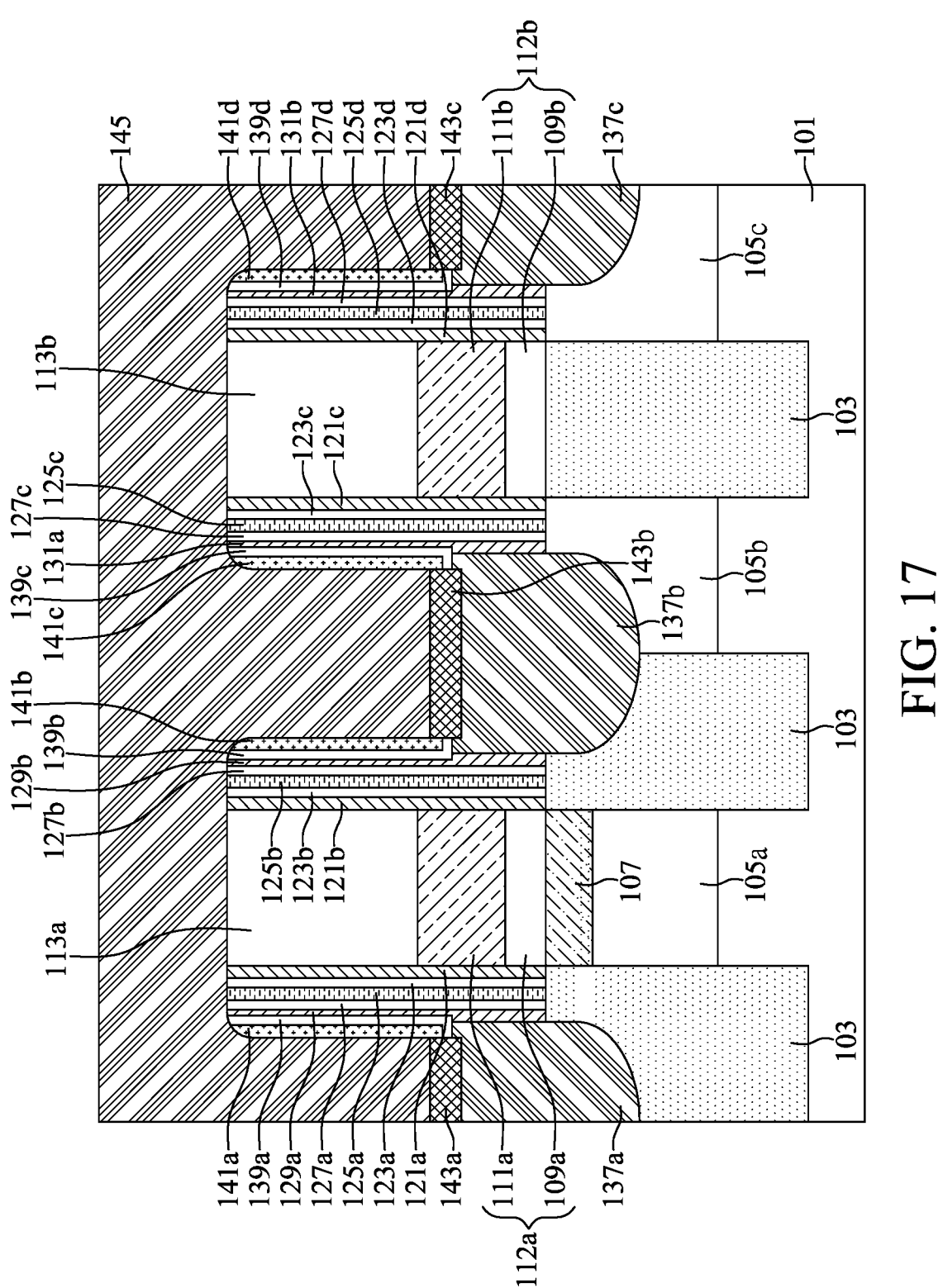

FIG. 17 is a cross-sectional view illustrating an intermediate stage of forming an upper capacitor contact material over the silicide layers and the bit line structures during the formation of the memory device, in accordance with some embodiments.

Figure 18:
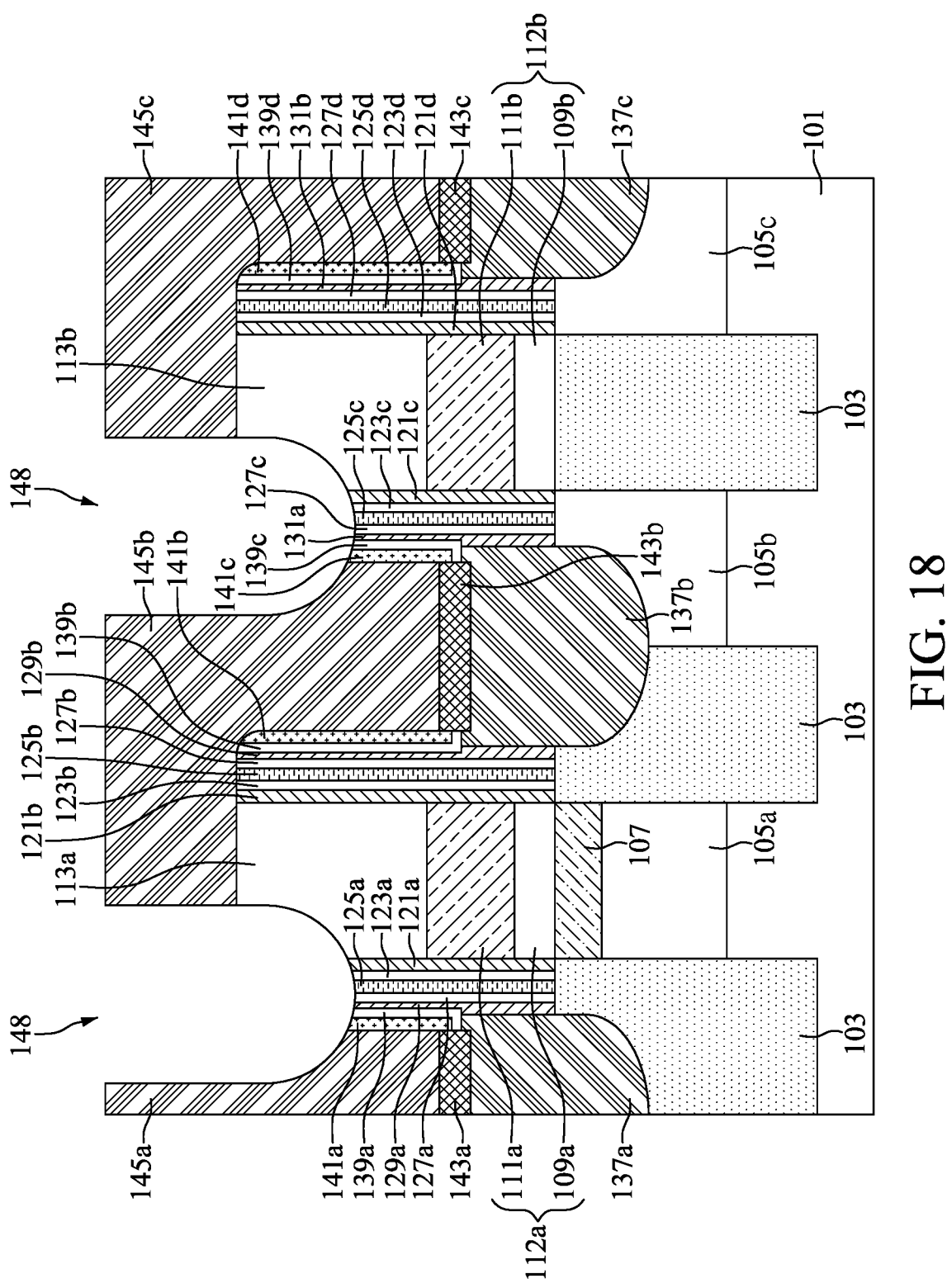

FIG. 18 is a cross-sectional view illustrating an intermediate stage of forming capacitor openings over the nitride and oxide spacers, in accordance with some embodiments.

Figure 19:
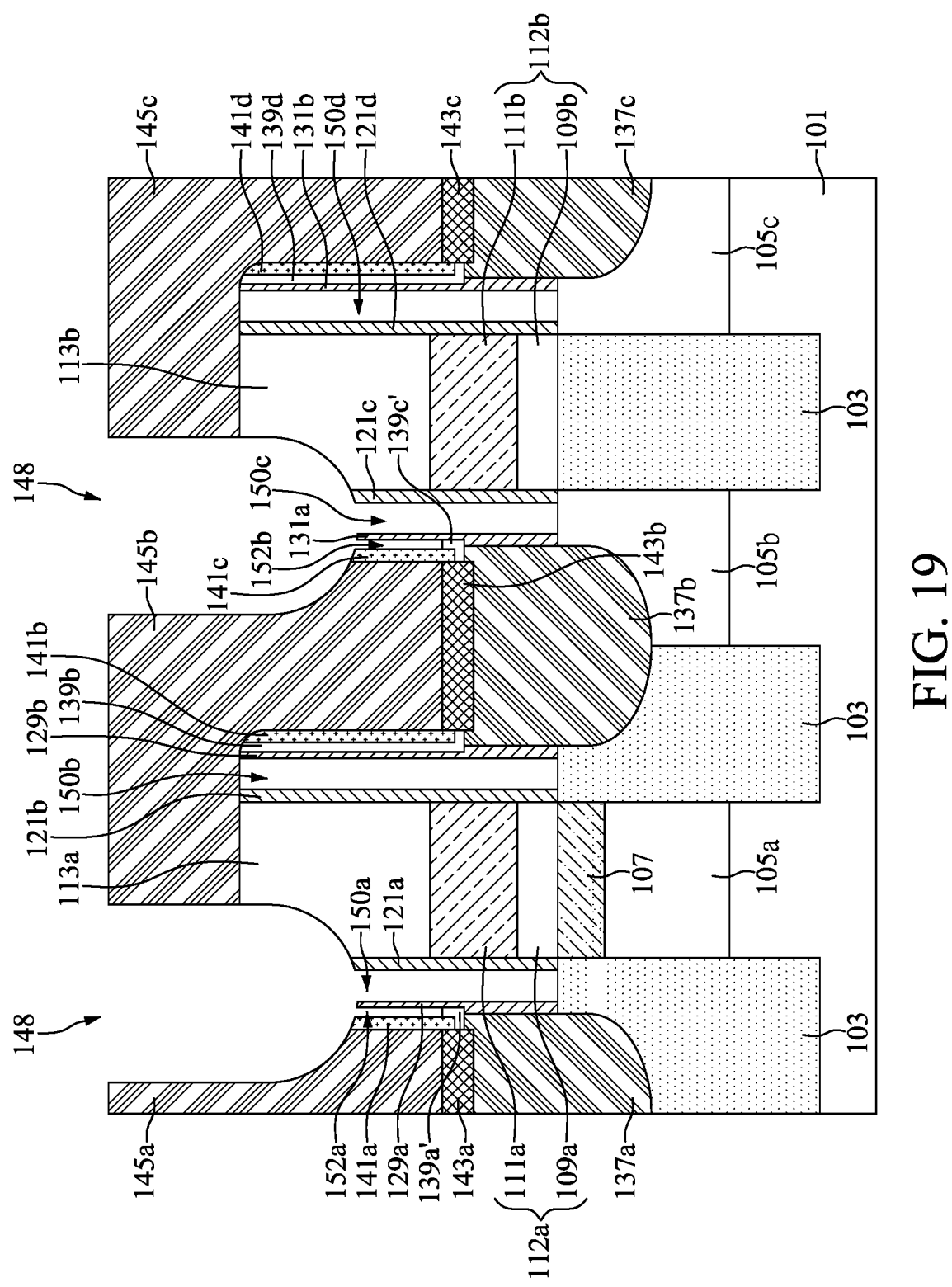

FIG. 19 is a cross-sectional view illustrating an intermediate stage of etching the oxide spacers through the capacitor openings to form gaps, in accordance with some embodiments.

Figure 20:
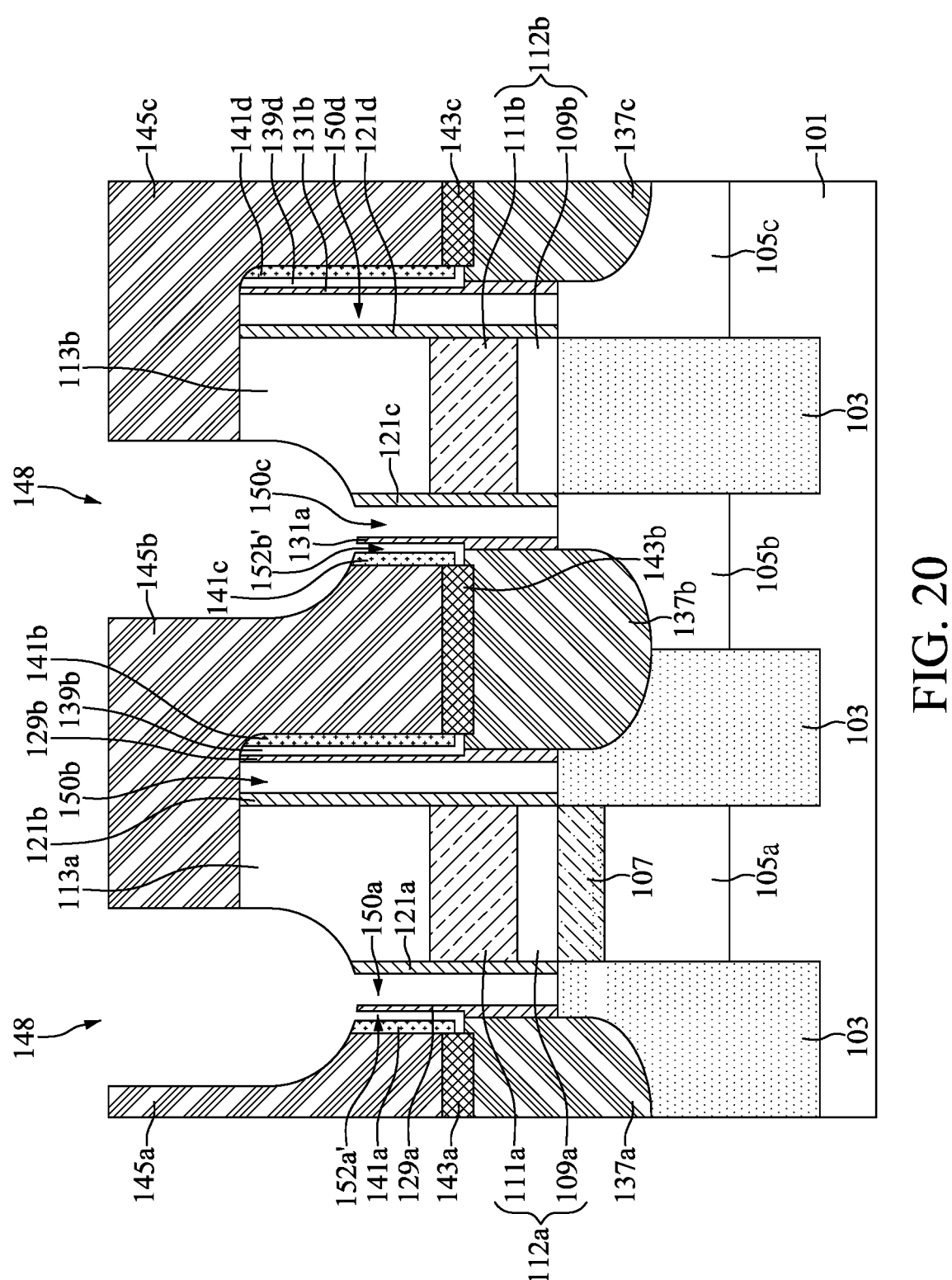

FIG. 20 is a cross-sectional view illustrating an intermediate stage of performing a post-etch cleaning process, in accordance with some embodiments.

Figure 21:
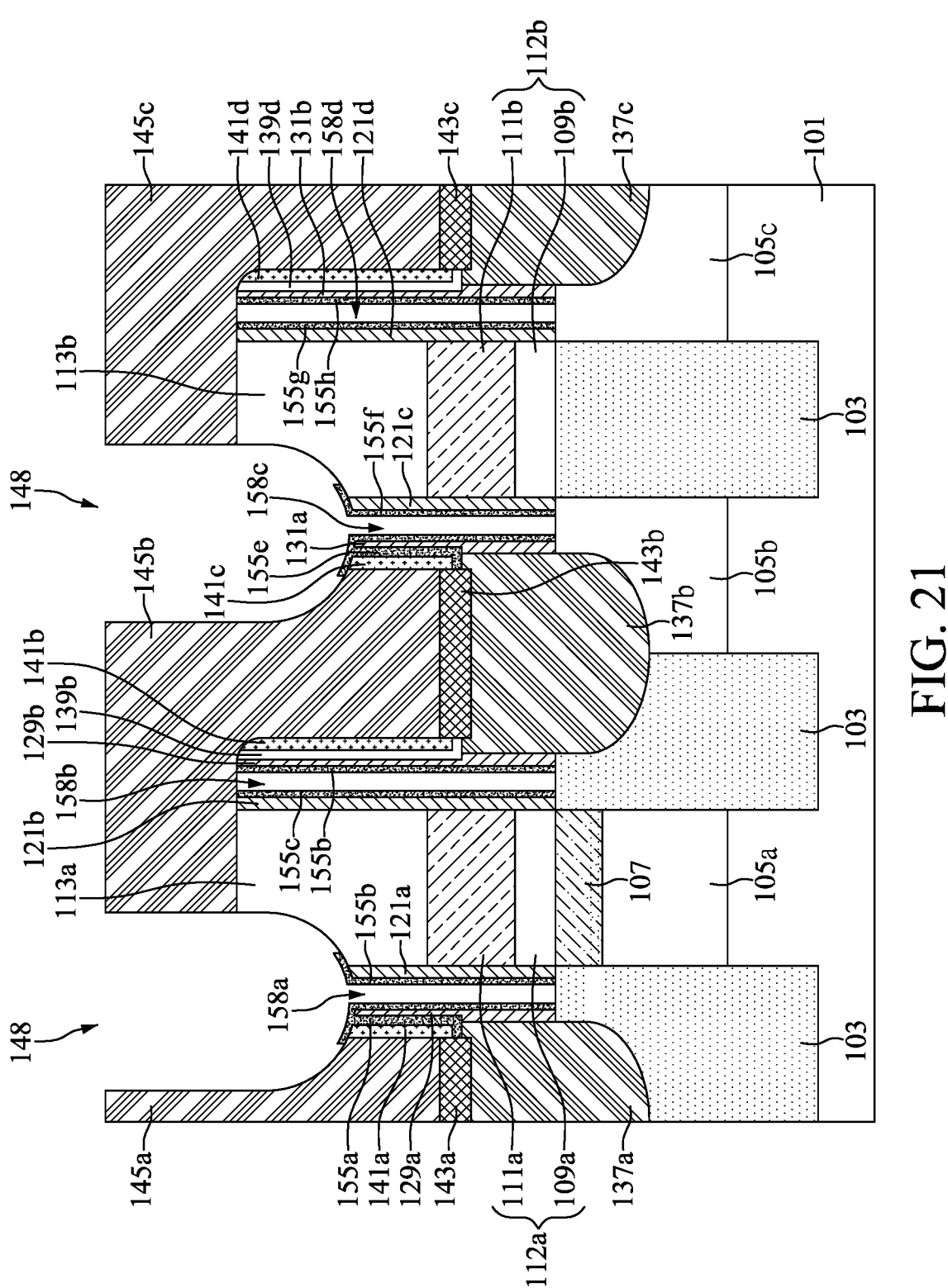

FIG. 21 is a cross-sectional view illustrating an intermediate stage of performing an oxidation process to form oxide liners in the gaps, in accordance with some embodiments.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
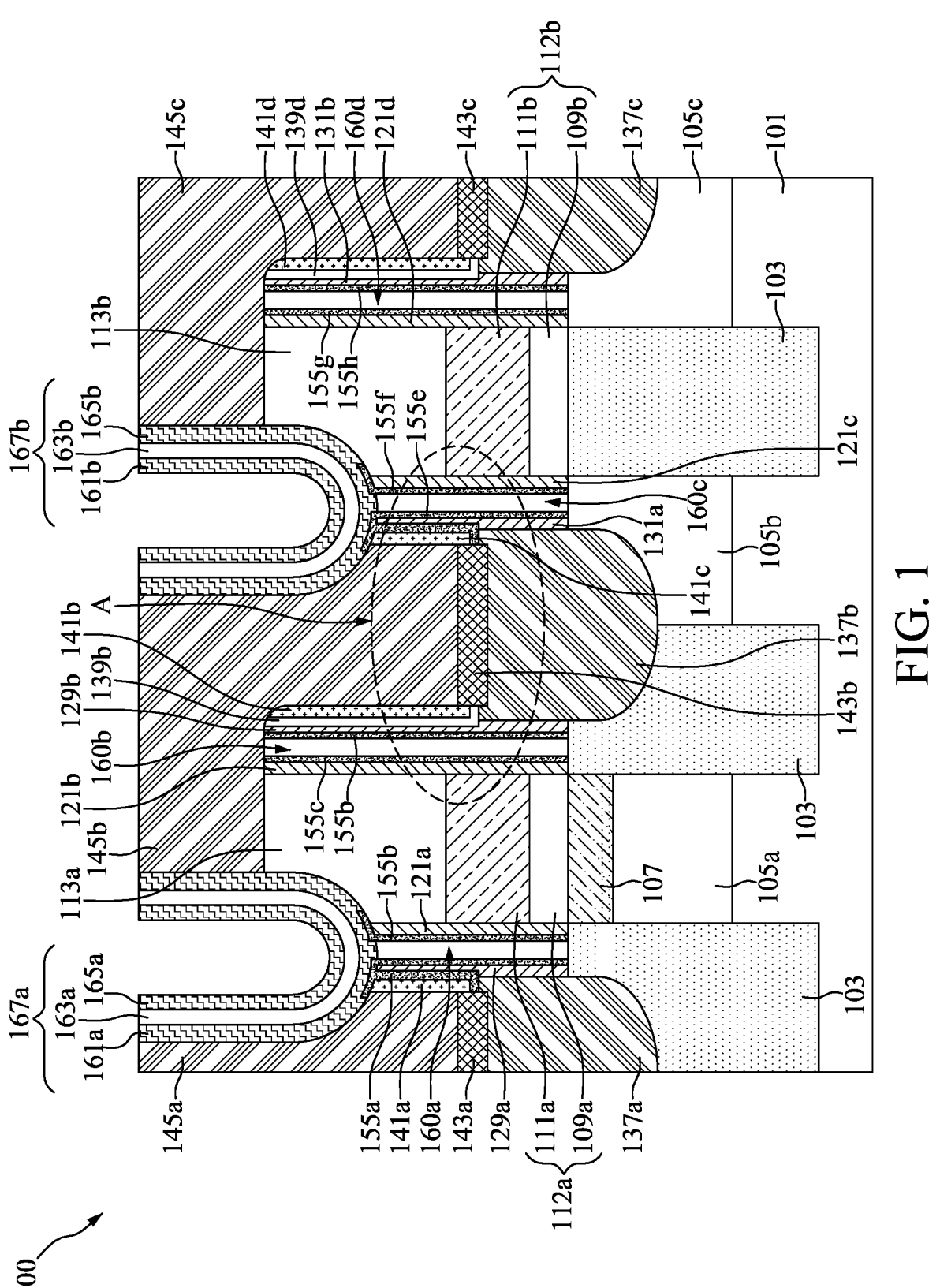
FIG. 1 is a cross-sectional view illustrating a memory device, in accordance with some embodiments.
Figure 2:
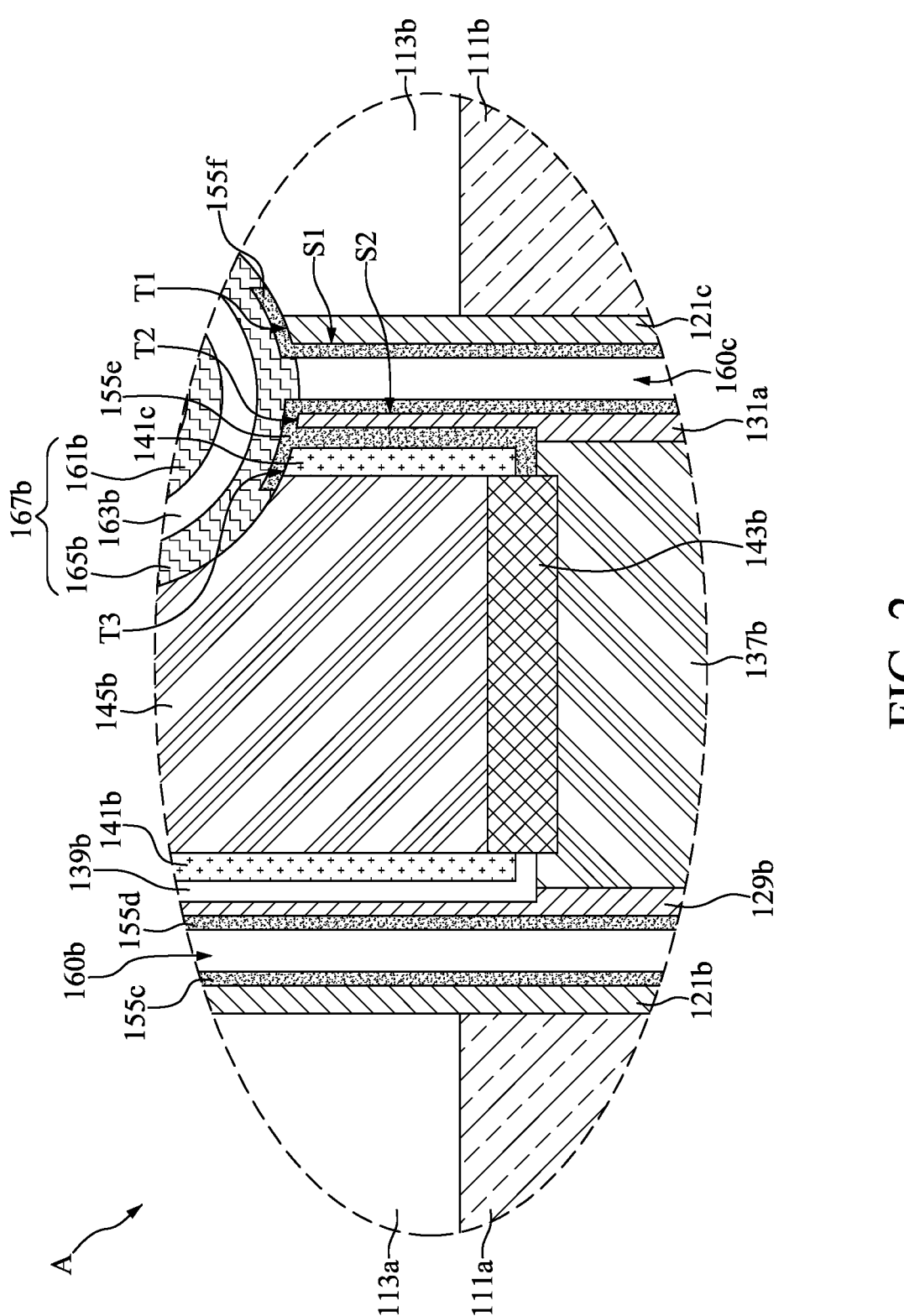
FIG. 2 is an enlarged view of region A in FIG. 1, in accordance with some embodiments.

FIG. 1 is a cross-sectional view illustrating a memory device 100, and FIG. 2 is an enlarged view of the region A in FIG. 1, in accordance with some embodiments.

As shown in FIGS. 1 and 2, the memory device 100 includes a semiconductor substrate 101, isolation structures 103 and doped regions 105a, 105b and 105c disposed in the semiconductor substrate 101. In some embodiments, the doped regions 105a, 105b and 105c are active regions that are electrically isolated from each other by the isolation structures 103. In addition, the memory device 100 includes a bit line contact 107 disposed in the doped region 105a.

Moreover, the memory device 100 includes bit line structures 112a and 112b disposed over the semiconductor substrate 101. In some embodiments, the bit line structure 112a includes a lower bit line layer 109a and an upper bit line layer 111a disposed over the lower bit line layer 109a. In some embodiments, the bit line structure 112b includes a lower bit line layer 109b and an upper bit line layer 111b disposed over the lower bit line layer 109b. In addition, bit line mask layers 113a and 113b are disposed over the bit line structures 112a and 112b, respectively.

In some embodiments, lower capacitor contacts 137a, 137b and 137c are disposed adjacent to the bit line structures 112a and 112b. For example, the lower capacitor contact 137a is disposed adjacent to the bit line structure 112a, the lower capacitor contact 137b is disposed between and adjacent to the bit line structures 112a and 112b, and the lower capacitor contact 137c is disposed adjacent to the bit line structure 112b. In some embodiments, the silicide layers 143a, 143b and 143c are disposed over the lower capacitor contacts 137a, 137b and 137c, respectively. In some embodiments, the upper capacitor contacts 145a, 145b and 145c are disposed over and in direct contact with the silicide layers 143a, 143b and 143c, respectively. In some embodiments, the upper capacitor contact 145b extends over the bit line mask layer 113a, and the upper capacitor contact 145c extends over the bit line mask layer 113b.

In some embodiments, nitride spacers 121a and 121b are disposed on and in direct contact with opposite sidewalls of the bit line structure 112a, and nitride spacers 121c and 121d are disposed on and in direct contact with opposite sidewalls of the bit line structure 112b. Moreover, the nitride spacers 121a and 121b extend to cover opposite sidewalls of the bit line mask layer 113a, and the nitride spacers 121c and 121d extend to cover opposite sidewalls of the bit line mask layer 113b, in accordance with some embodiments.

In some embodiments, a nitride spacer 129a is disposed between the bit line structure 112a and the lower capacitor contact 137a, a nitride spacer 129b is disposed between the bit line structure 112a and the lower capacitor contact 137b, a nitride spacer 131a is disposed between the bit line structure 112b and the lower capacitor contact 137b, and a nitride spacer 131b is disposed between the bit line structure 112b and the lower capacitor contact 137c.

In some embodiments, oxide liners 155a and 155b are disposed between the nitride spacers 121a and 129a, and an air gap 160a is between the oxide liners 155a and 155b. In some embodiments, the oxide liner 155a is separated from the oxide liner 155b by the air gap 160a. In some embodiments, oxide liners 155c and 155d are disposed between the nitride spacers 121*b* and 129*b*, and an air gap 160*b* is between the oxide liners 155*c* and 155*d*. In some embodiments, the oxide liner 155*c* is separated from the oxide liner 155*d* by the air gap 160*b*.

In some embodiments, oxide liners 155*e* and 155*f* are disposed between the nitride spacers 121*c* and 131*a*, and an air gap 160*c* is between the oxide liners 155*e* and 155*f*. In some embodiments, the oxide liner 155*e* is separated from the oxide liner 155*f* by the air gap 160*c*. In some embodiments, oxide liners 155*g* and 155*h* are disposed between the nitride spacers 121*d* and 131*b*, and an air gap 160*d* is between the oxide liners 155*g* and 155*h*. In some embodiments, the oxide liner 155*g* is separated from the oxide liner 155*h* by the air gap 160*d*.

In some embodiments, a nitride spacer 141*a* is disposed between the nitride spacer 129*a* and the upper capacitor contact 145*a*, and the oxide liner 155*a* extends between the nitride spacers 129*a* and 141*a*. In some embodiments, the bottom surface of the nitride spacer 141*a* is higher than the bottom surface of the nitride spacer 121*a* and the bottom surface of the nitride spacer 129*a*. In some embodiments, the nitride spacers 121*a* and 129*a* are in direct contact with the semiconductor substrate 101. In some embodiments, the nitride spacer 141*a* is disposed over the lower capacitor contact 137*a*, and the nitride spacer 141*a* is separated from the lower capacitor contact 137*a* by the oxide liner 155*a*. In some embodiments, the oxide liner 155*a* is in direct contact with the silicide layer 143*a*.

In some embodiments, a nitride spacer 141*b* is disposed between the nitride spacer 129*b* and the upper capacitor contact 145*b*, and a native oxide layer 139*b* is disposed between the nitride spacer 129*b* and the nitride spacer 141*b*. In some embodiments, the bottom surface of the nitride spacer 141*b* is higher than the bottom surface of the nitride spacer 121*b* and the bottom surface of the nitride spacer 129*b*. In some embodiments, the nitride spacers 121*b* and 129*b* are in direct contact with the semiconductor substrate 101. In some embodiments, the nitride spacer 141*b* is disposed over the lower capacitor contact 137*b*, and the nitride spacer 141*b* is separated from the lower capacitor contact 137*b* by the native oxide layer 139*b*. In some embodiments, the native oxide layer 139*b* is in direct contact with the silicide layer 143*b*.

Moreover, in some embodiments, a nitride spacer 141*c* is disposed between the nitride spacer 131*a* and the upper capacitor contact 145*b*, and the oxide liner 155*e* extends between the nitride spacers 131*a* and 141*c*. In some embodiments, the bottom surface of the nitride spacer 141*c* is higher than the bottom surface of the nitride spacer 121*c* and the bottom surface of the nitride spacer 131*a*. In some embodiments, the nitride spacers 121*c* and 131*a* are in direct contact with the semiconductor substrate 101. In some embodiments, the nitride spacer 141*c* is disposed over the lower capacitor contact 137*b*, and the nitride spacer 141*c* is separated from the lower capacitor contact 137*b* by the oxide liner 155*e*. In some embodiments, the oxide liner 155*e* is in direct contact with the silicide layer 143*b*.

In some embodiments, a nitride spacer 141*d* is disposed between the nitride spacer 131*b* and the upper capacitor contact 145*c*, and a native oxide layer 139*d* is disposed between the nitride spacer 131*b* and the nitride spacer 141*d*. In some embodiments, the bottom surface of the nitride spacer 141*d* is higher than the bottom surface of the nitride spacer 121*d* and the bottom surface of the nitride spacer 131*b*. In some embodiments, the nitride spacers 121*d* and 131*b* are in direct contact with the semiconductor substrate 101. In some embodiments, the nitride spacer 141*d* is disposed over the lower capacitor contact 137*c*, and the nitride spacer 141*d* is separated from the lower capacitor contact 137*c* by the native oxide layer 139*d*. In some embodiments, the native oxide layer 139*d* is in direct contact with the silicide layer 143*c*.

Furthermore, the memory device 100 includes a capacitor 167*a* disposed over the nitride spacers 121*a*, 129*a* and 141*a*, and a capacitor 167*b* disposed over the nitride spacers 121*c*, 131*a* and 141*c*. In some embodiments, the capacitor 167*a* includes a bottom electrode 161*a*, a top electrode 165*a* disposed over and surrounded by the bottom electrode 161*a*, and a capacitor dielectric layer 163*a* sandwiched between the bottom electrode 161*a* and the top electrode 165*a*. In some embodiments, the nitride spacers 129*a* and 141*a* are separated from the capacitor 167*a* by the oxide liner 155*a*, and the nitride spacer 121*a* is separated from the capacitor 167*a* by the oxide liner 155*b*.

In some embodiments, the capacitor 167*b* includes a bottom electrode 161*b*, a top electrode 165*b* disposed over and surrounded by the bottom electrode 161*b*, and a capacitor dielectric layer 163*b* sandwiched between the bottom electrode 161*b* and the top electrode 165*b*. In some embodiments, the nitride spacers 131*a* and 141*c* are separated from the capacitor 167*b* by the oxide liner 155*e*, and the nitride spacer 121*c* is separated from the capacitor 167*b* by the oxide liner 155*f*.

As shown in FIG. 2, a top surface T1 and a sidewall S1 of the nitride spacer 121*c* are covered by and in direct contact with the oxide liner 155*f*, and a top surface T2 and a sidewall S2 of the nitride spacer 131*a* are covered by and in direct contact with the oxide liner 155*e*. In some embodiments, a top surface T3 of the nitride spacer 141*c* is covered by and in direct contact with the oxide liner 155*e*, in accordance with some embodiments. Similar features also present in the nitride spacers 121*a*, 129*a*, 141*a* and the oxide liners 155*a* and 155*b*, and are not repeated herein.

Embodiments of the memory device 100 and method for preparing the same are provided in the disclosure. In some embodiments, the air gaps 160*a*, 160*b*, 160*c* and 160*d* are disposed between the oxide liners 155*a*, 155*b*, 155*c*, 155*d*, 155*e*, 155*f*, 155*g* and 155*h*, which may reduce parasitic capacitance and correspondingly improve device performance (e.g., by reducing signal noise). Moreover, the oxide liners 155*a*, 155*b*, 155*e* and 155*f* help to prevent the nitride spacers 121*a*, 129*a*, 121*c* and 131*a* from being etched through during the formation of the air gaps 160*a*, 160*b*, 160*c* and 160*d*. As a result, the short issue from the bit line structures 112*a* and 112*b* to the lower capacitor contacts 137*a* and 137*b* can be prevented.

FIG. 3 is a flow diagram illustrating a method 10 for preparing the memory device 100, and the method 10 includes steps S11, S13, S15, S17, S19, S21, S23, S25, S27 and S29, in accordance with some embodiments. The steps S11 to S29 of FIG. 3 are elaborated in connection with the following figures.

FIGS. 4-11, 13-15, and 17-21 are cross-sectional views illustrating intermediate stages in the formation of the memory device 100, in accordance with some embodiments. FIG. 12 is an enlarged view of region A in FIG. 11, and FIG. 16 is an enlarged view of region A in FIG. 15, in accordance with some embodiments.

Figure 4:
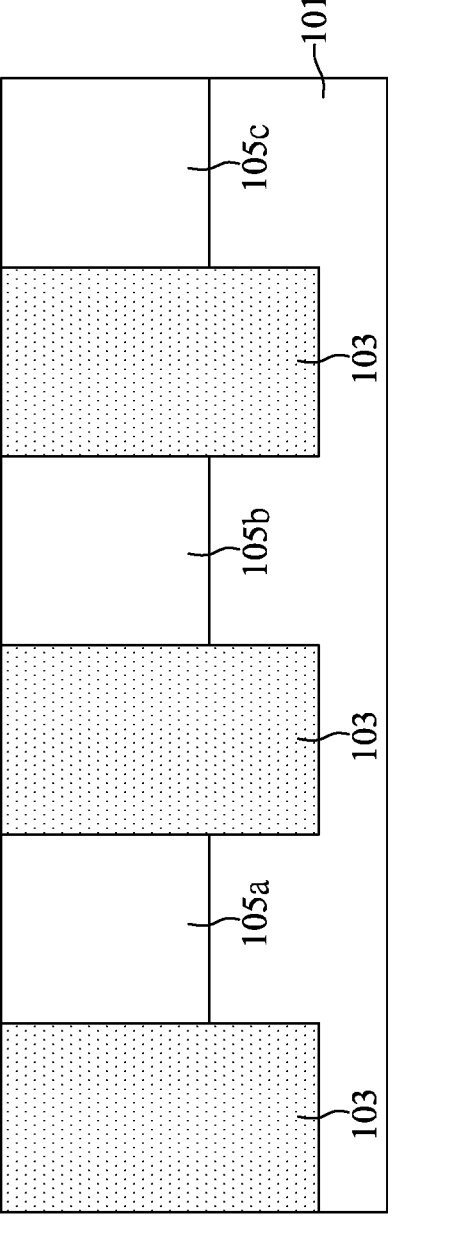
FIG. 4 is a cross-sectional view illustrating an intermediate stage of forming isolation structures and doped regions in a semiconductor substrate during the formation of the memory device, in accordance with some embodiments.

As shown in FIG. 4, the semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials.

Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

Still referring to FIG. 4, the isolation structures 103 are formed in the semiconductor substrate 101, and the isolation structures 103 are shallow trench isolation (STI) structures, in accordance with some embodiments. In addition, the isolation structures 103 may be made of silicon oxide, silicon nitride, silicon oxynitride or another applicable dielectric material, and the formation of the isolation structures 103 may include forming a patterned mask (not shown) over the semiconductor substrate 101, etching the semiconductor substrate 101 to form openings (not shown) by using the patterned mask as a mask, depositing a dielectric material in the openings and over the semiconductor substrate 101, and planarizing the dielectric material until the semiconductor substrate 101 is exposed.

Moreover, doped regions 105a, 105b and 105c are formed in the active regions defined by the isolation structures 103. In some embodiments, the doped regions 105a, 105b and 105c are formed by one or more ion implantation processes, and P-type dopants, such as boron (B), gallium (Ga), or indium (In), or N-type dopants, such as phosphorous (P) or arsenic (As), can be implanted in the active regions to form the doped regions 105a, 105b and 105c, depending on the conductivity type of the memory device 100. In addition, the doped regions 105a, 105b and 105c will become the source/drain regions of the memory device 100 in the subsequent processes.

Figure 5:
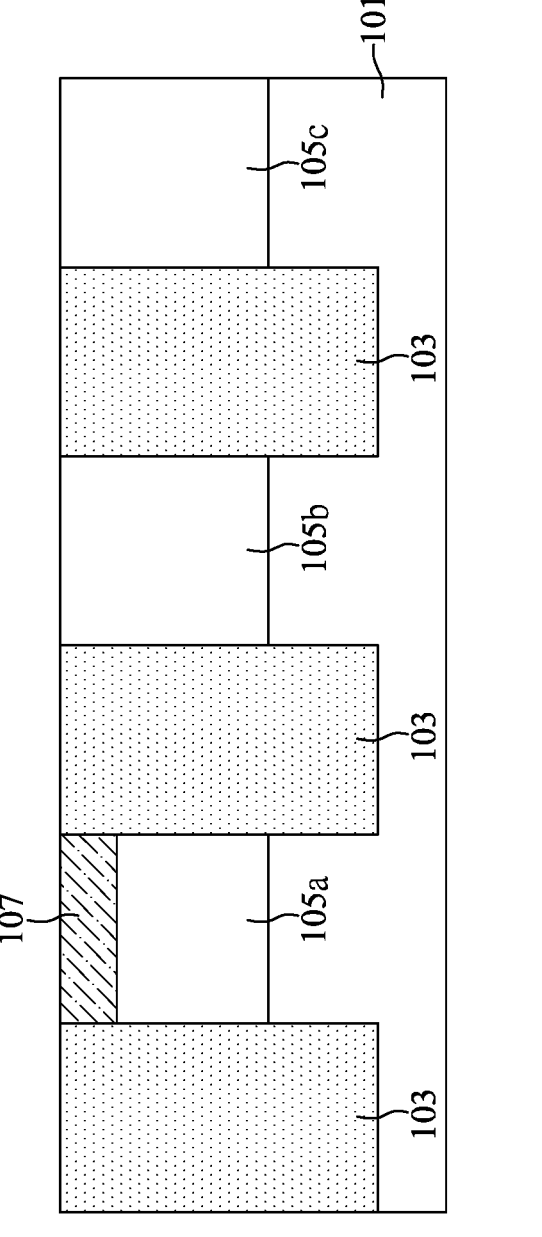
FIG. 5 is a cross-sectional view illustrating an intermediate stage of forming a bit line contact in the semiconductor substrate during the formation of the memory device, in accordance with some embodiments.

After the isolation structures 103 and the doped regions 105a, 105b and 105c are formed, a bit line contact 107 is formed in the semiconductor substrate 101, as shown in FIG. 5 in accordance with some embodiments. In some embodiments, the bit line contact 107 is formed in the doped region 105a. In some embodiments, the bit line contact 107 may be made of doped polysilicon, metal, metal silicide or another applicable conductive material, and the formation of the bit line contact 107 may include forming a patterned mask (not shown) over the semiconductor substrate 101, etching the semiconductor substrate 101 to form an opening (not shown) by using the patterned mask as a mask, depositing a conductive material in the opening and over the semiconductor substrate 101, and planarizing the conductive material until the semiconductor substrate 101 is exposed.

Figure 6:
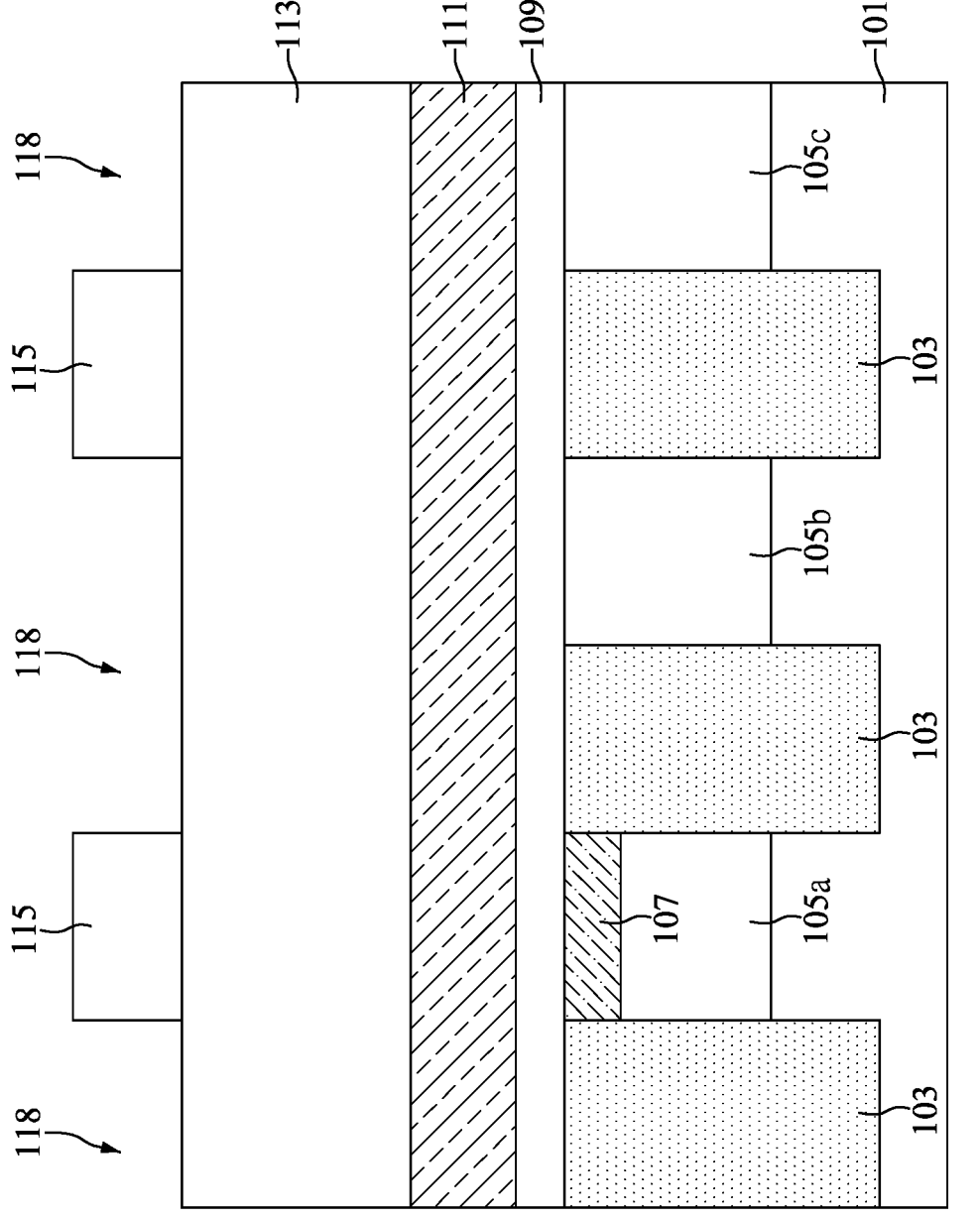
FIG. 6 is a cross-sectional view illustrating an intermediate stage of forming bit line materials over the semiconductor substrate during the formation of the memory device, in accordance with some embodiments.

Next, a lower bit line material 109, an upper bit line material 111, a bit line mask material 113 and a patterned mask 115 are sequentially formed over the semiconductor substrate 101, as shown in FIG. 6 in accordance with some embodiments. In some embodiments, the patterned mask 115 has openings 118 exposing the bit line mask material 113. In some embodiments, the lower bit line material 109 includes titanium nitride (TiN), tantalum nitride (TaN), tantalum carbide (TaC), and titanium carbide (TiC), or another suitable conductive material.

In some embodiments, the upper bit line material 111 includes tungsten (W), titanium (Ti), nickel (Ni), cobalt (Co), or a combination thereof. In some embodiments, the bit line mask material 113 includes silicon nitride. However, the material is merely exemplary. Any other suitable materials may alternatively be used to from the bit line mask material 113. In some embodiments, the bit line mask material 113 and the patterned mask 115 include different materials so that the etching selectivities may be different in the subsequent etching process.

In addition, the lower bit line material 109 is formed by a deposition process, such as a chemical vapor deposition (CVD) process, a physical vapor deposition (PVD) process, an atomic layer deposition (ALD) process, a spin-on coating process, in accordance with some embodiments. Some processes used to form the upper bit line material 111 and the bit line mask material 113 are similar to, or the same as, those used to form the lower bit line material 109, and details thereof are not repeated herein.

Figure 7:
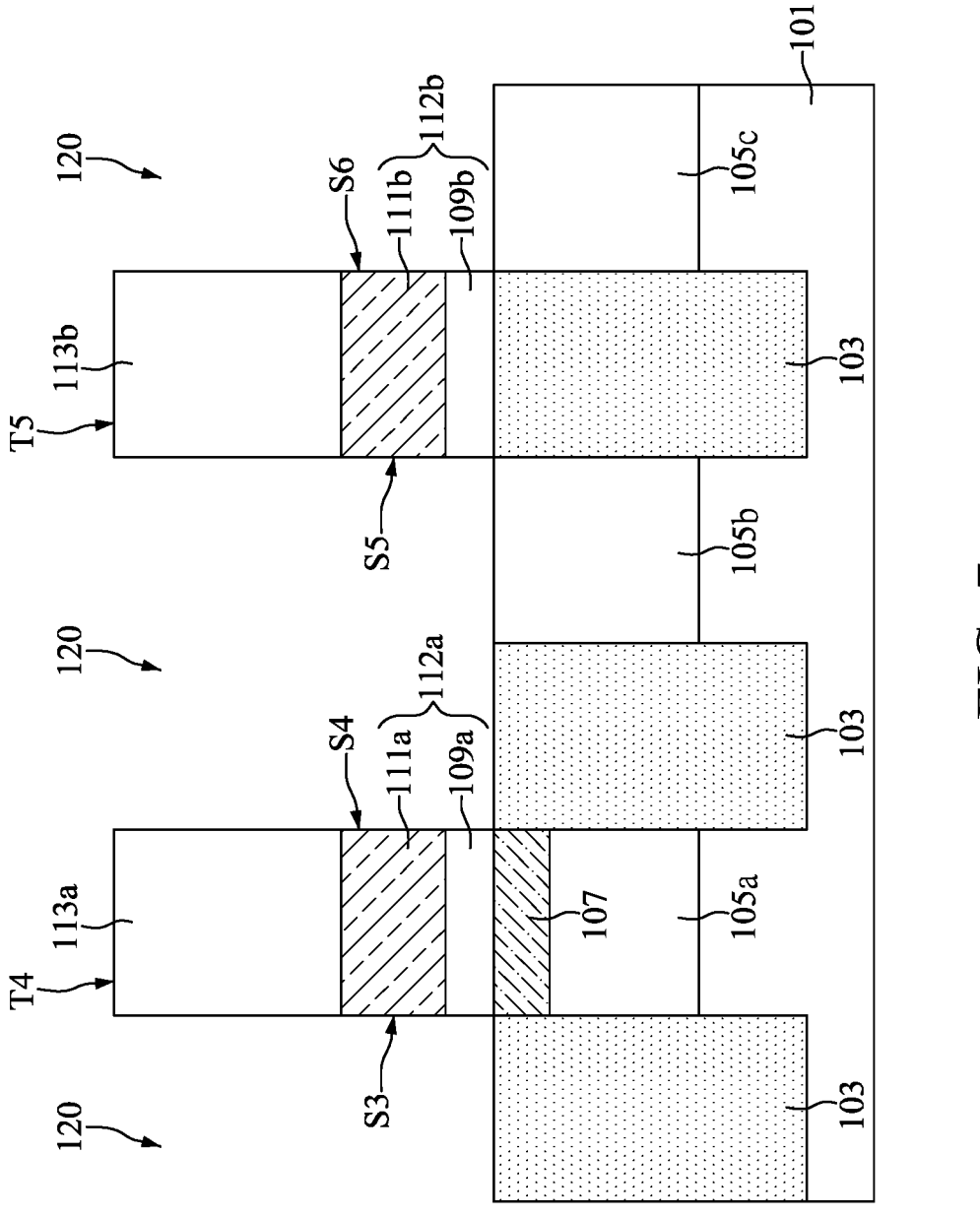
FIG. 7 is a cross-sectional view illustrating an intermediate stage of etching the bit line materials to form bit line structures during the formation of the memory device, in accordance with some embodiments.

Subsequently, an etching process is performed using the patterned mask 115 as an etching mask, such that bit line structures 112a and 112b are formed, as shown in FIG. 7 in accordance with some embodiments. The respective step is illustrated as the step S11 in the method 10 shown in FIG. 3. In some embodiments, openings 120 are formed penetrating through the bit line mask material 113, the upper bit line material 111, and the lower bit line material 109, and the bit line structures 112a and 112b are separated from each other.

In some embodiments, the bit line structure 112a includes a lower bit line layer 109a and an upper bit line layer 111a, and the bit line structure 112a is covered by the bit line mask layer 113a. In some embodiments, the bit line structure 112b includes a lower bit line layer 109b and an upper bit line layer 111b, and the bit line structure 112b is covered by the bit line mask layer 113b. Moreover, opposite sidewalls S3 and S4 of the bit line structure 112a and opposite sidewalls S5 and S6 of the bit line structure 112b are exposed by the openings 120, in accordance with some embodiments. In some embodiments, the etching process for forming the bit line structures 112a and 112b includes a wet etching process, a dry etching process, or a combination thereof. After the bit line structures 112a and 112b are formed, the patterned mask 115 may be removed.

Figure 8:
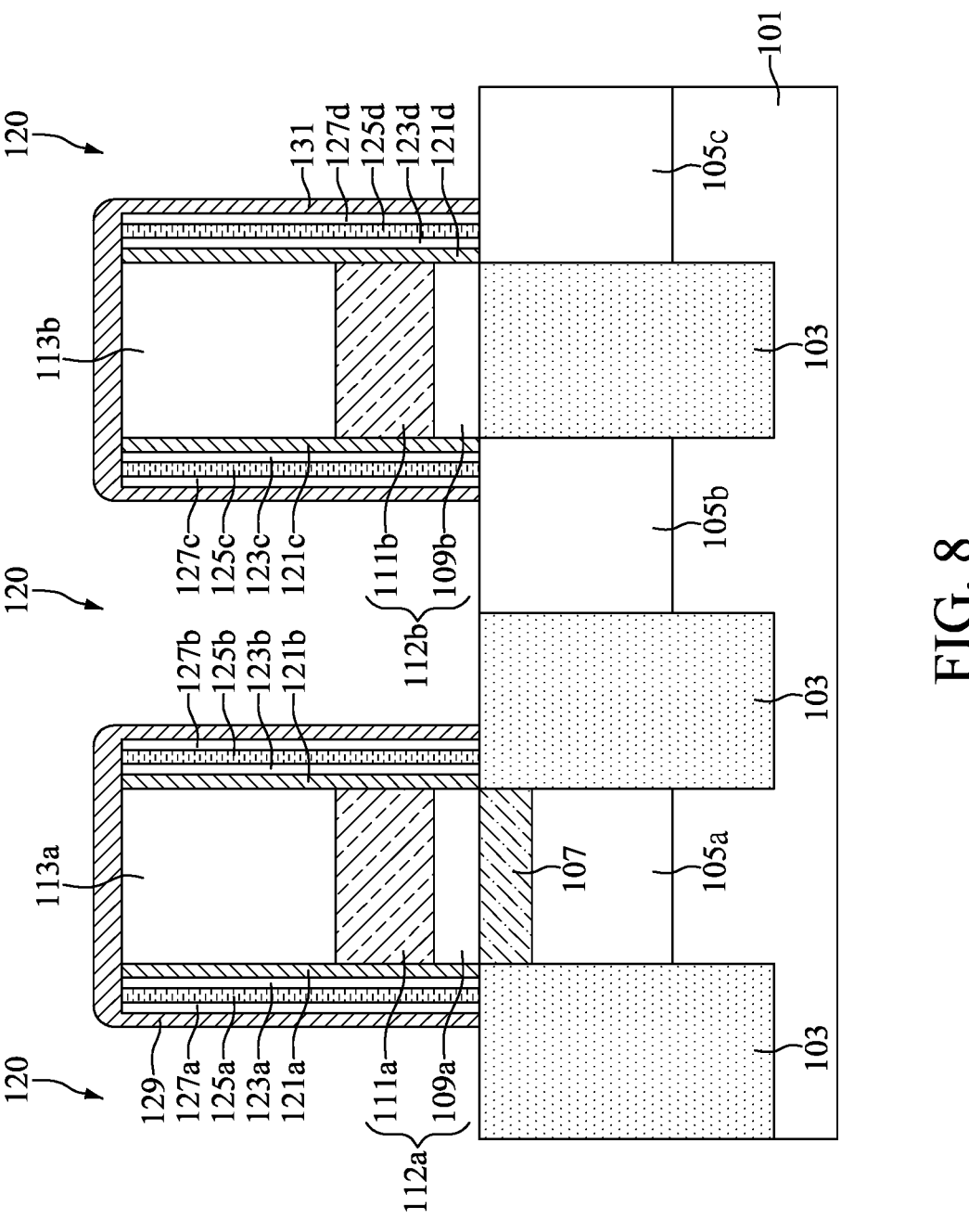
FIG. 8 is a cross-sectional view illustrating an intermediate stage of forming nitride and oxide spacers on sidewalls of the bit line structures during the formation of the memory device, in accordance with some embodiments.

Then, nitride spacers 121a and 121b, native oxide layers 123a and 123b, oxide spacers 125a and 125b, and native oxide layers 127a and 127b are formed on opposite sidewalls S3 and S4 of the bit line structure 112a, and nitride spacers 121c and 121d, native oxide layers 123c and 123d, oxide spacers 125c and 125d, and native oxide layers 127c and 127d are formed on opposite sidewalls S5 and S6 of the bit line structure 112b, as shown in FIG. 8 in accordance with some embodiments. In some embodiments, the opposite sidewalls of the bit line mask layer 113a are covered by the nitride spacers 121a and 121b, the native oxide layers 123a and 123b, the oxide spacers 125a and 125b, and native oxide layers 127a and 127b, and the opposite sidewalls of the bit line mask layer 113b are covered by the nitride spacers 121c and 121d, the native oxide layers 123c and 123d, the oxide spacers 125c and 125d, and native oxide layers 127c and 127d.

In some embodiments, the nitride spacers 121a, 121b, 121c and 121d include silicon nitride, and the oxide spacers 125a, 125b, 125c and 125d include silicon oxide. In some embodiments, the native oxide layer 123a, 123b, 123c, 123d, 127a, 127b, 127c and 127d include silicon oxide. In some embodiments, the nitride spacers 121a, 121b, 121c and 121d are formed by a deposition process (e.g., a CVD process or an ALD process) and a subsequent etching process. In some embodiments, the etching process for forming the nitride spacers 121a, 121b, 121c and 121d is an anisotropic etching process, which removes the same amount of the spacer material vertically in all places, leaving the nitride spacers 121a, 121b, 121c and 121d on the sidewalls S3, S4, S5 and S6 of the bit line structures 112a and 112b. In some embodiments, the oxide spacers 125a, 125b, 125c and 125d are formed by an ALD process. Some processes used to form the oxide spacers 125a, 125b, 125c and 125d, and the native oxide layers 123a, 123b, 123c, 123d, 127a, 127b, 127c and 127d are similar to, or the same as, those used to form the nitride spacers 121a, 121b, 121c and 121d, and details thereof are not repeated herein.

Still referring to FIG. 8, a nitride spacer material 129 is formed covering the native oxide layers 127a and 127b, and the top surface T4 (see FIG. 7) of the bit line structure 112a, and a nitride spacer material 131 is formed covering the native oxide layers 127c and 127d, and the top surface T5 (see FIG. 7) of the bit line structure 112b, in accordance with some embodiments. In some embodiments, the nitride spacer materials 129 and 131 include silicon nitride. In some embodiments, the nitride spacer materials 129 and 131 are formed by a deposition process and a subsequent etching process. The nitride spacer materials 129 and 131 may also be referred to as nitride spacers. The respective step is illustrated as the step S13 in the method 10 shown in FIG. 3.

Figure 9:
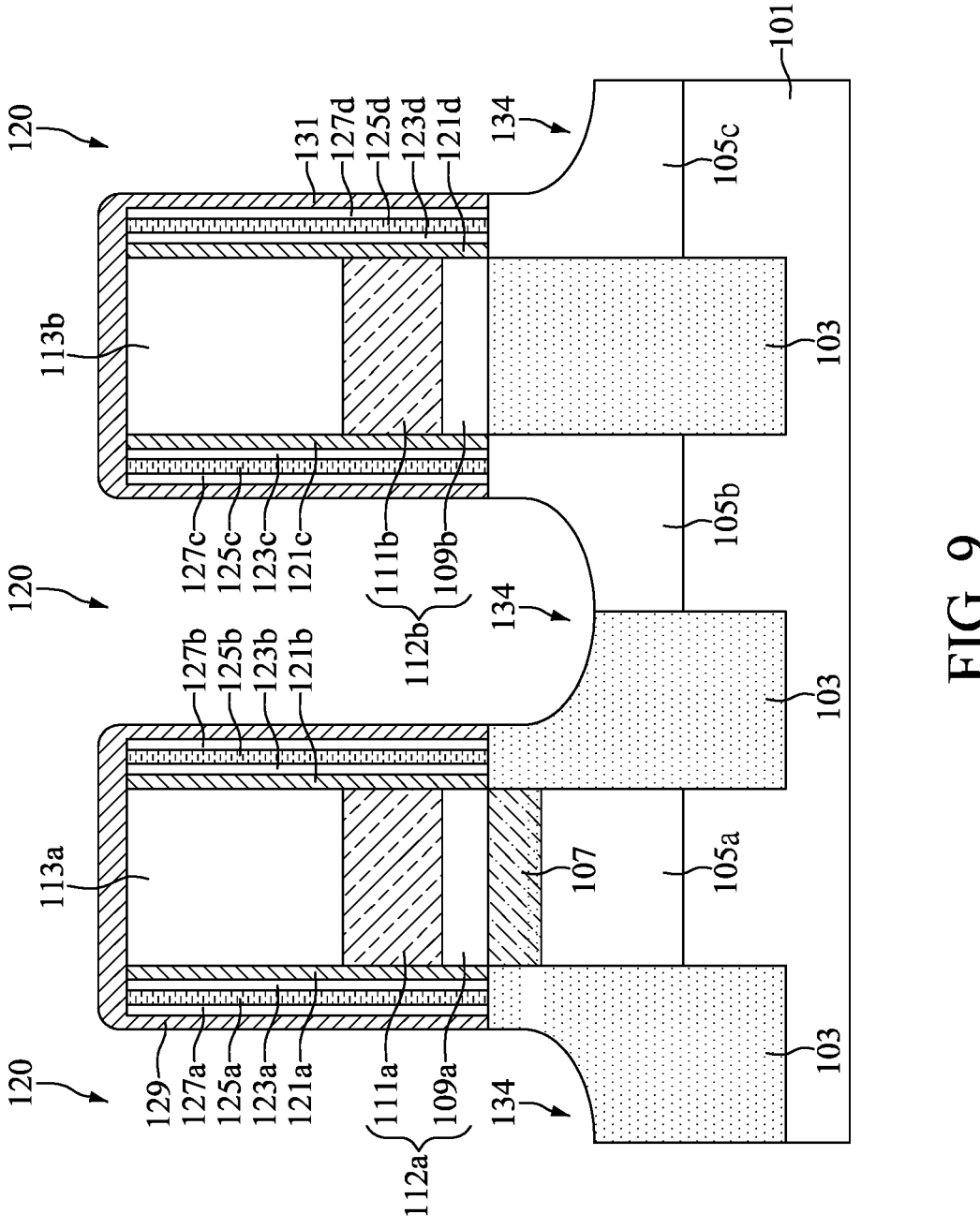
FIG. 9 is a cross-sectional view illustrating an intermediate stage of forming openings adjacent to the bit line structures during the formation of the memory device, in accordance with some embodiments.

Next, an etching process is performed on the semiconductor substrate 101, such that openings 134 are formed adjacent to the bit line structures 112a and 112b, as shown in FIG. 9 in accordance with some embodiments. In some embodiments, the nitride spacer materials 129 and 131 are used as an etching mask to form the openings 134. In some embodiments, the openings 134 are adjacent to the nitride spacer materials 129 and 131. In some embodiments, the etching process includes a wet etching process, a dry etching process, or a combination thereof.

Subsequently, a lower capacitor contact material 137 is formed over the structure of FIG. 9, as shown in FIG. 10 in accordance with some embodiments. In some embodiments, the openings 134 are filled by the lower capacitor contact material 137. In some embodiments, the lower capacitor contact material 137 includes a conductive material, such as copper (Cu), tungsten (W), aluminum (Al), titanium (Ti), tantalum (Ta), gold (Au), silver (Ag). The lower capacitor contact material 137 may be formed by a deposition process, such as a CVD process, a PVD process, a sputtering process, a plating process, or another suitable process.

Then, an etching process is performed on the lower capacitor contact material 137, such that lower capacitor contacts 137a, 137b and 137c are formed adjacent to the bit line structures 112a and 112b, as shown in FIG. 11 in accordance with some embodiments. In some embodiments, the lower capacitor contact 137a is disposed adjacent to the nitride spacer material 129. In some embodiments, the lower capacitor contact 137b is disposed between and adjacent to the nitride spacer materials 129 and 131. In some embodiments, the lower capacitor contact 137c is disposed adjacent to the nitride spacer material 131. The respective step is illustrated as the step S15 in the method 10 shown in FIG. 3. In some embodiments, the etching process includes a wet etching process, a dry etching process, or a combination thereof.

In addition, the nitride spacer materials 129 and 131 are partially etched during the etching process for forming the lower capacitor contacts 137a, 137b and 137c, in accordance with some embodiments. As shown in FIG. 12, the nitride spacer material 129 has a width W1 lower than the top surface T6 of the lower capacitor contact 137b, and a width W2 higher than the top surface T6 of the lower capacitor contact 137b. In some embodiments, the width W1is greater than the width W2. Similarly, the nitride spacer material 131 has a width W3 lower than the top surface T6 of the lower capacitor contact 137b, and a width W4 higher than the top surface T6 of the lower capacitor contact 137b. The width W3 is greater than the width W4, as shown in FIG. 12 in accordance with some embodiments.

Next, a native oxide material 139 and a nitride spacer material 141 are sequentially formed over the structure of FIG. 11, as shown in FIG. 13 in accordance with some embodiments. In some embodiments, the lower capacitor contacts 137a, 137b and 137c, and the nitride spacer materials 129 and 131 are covered by the native oxide material 139, and the native oxide material 139 is covered by the nitride spacer material 141.

In some embodiments, the native oxide material 139 includes silicon oxide. In some embodiments, the nitride spacer material 141 includes silicon nitride. Moreover, the native oxide material 139 and the nitride spacer material 141 may be formed by deposition processes, such as CVD processes, PVD processes, ALD processes, spin-on coating processes.

Subsequently, an etching process is performed to expose the lower capacitor contacts 137a, 137b and 137c, and to expose the bit line mask layers 113a and 113b, as shown in FIG. 14 in accordance with some embodiments. In some embodiments, the portions of the native oxide material 139 and the nitride spacer material 141 covering the top surfaces of the lower capacitor contacts 137a, 137b and 137c, and the portions of the native oxide material 139 and the nitride spacer material 141 covering the top surfaces of the bit line mask layers 113a and 113b are removed. As a result, nitride spacers 141a, 141b, 141c and 141d (i.e., the remaining portions of the nitride spacer material 141), and native oxide layers 139a, 139b, 139c and 139d (i.e., the remaining portions of the native oxide material 139) are obtained. The respective step is illustrated as the step S17 in the method 10 shown in FIG. 3.

Moreover, the portions of the nitride spacer materials 129 and 131 covering the top surfaces of the bit line mask layers 113a and 113b are removed, in accordance with some embodiments. As a result, the nitride spacers 129a and 129b (i.e., the remaining portions of the nitride spacer material 129), and the nitride spacers 131a and 131b (i.e., the remaining portions of the nitride spacer material 131) are obtained. In some embodiments, the etching process for exposing the lower capacitor contacts 137a, 137b and 137c includes a wet etching process, a dry etching process, or a combination thereof.

Then, silicide layers 143a, 143b and 143c are formed over the exposed surfaces of the lower capacitor contacts 137a, 137b and 137c, as shown in FIG. 15 in accordance with some embodiments. The respective step is illustrated as the step S19 in the method 10 shown in FIG. 3. In some embodiments, the silicide layers 143a, 143b and 143c are formed by a silicidation process, which includes a metal material deposition process and an annealing process performed in sequence. In some embodiments, the deposition process of the silicidation process includes a CVD process, a PVD process, an ALD process, or another suitable process. In some embodiments, the annealing process of the silicidation process is performed at a temperature in a range from about 300° C. to about 800° C. After the annealing process, the unreacted metal material is removed.

In some embodiments, the silicide layers 143a, 143b and 143c are in direct contact with the native oxide layers 139a, 139b, 139c and 139d. In some embodiments, the silicide layers 143a, 143b and 143c are in direct contact with the nitride spacers 141a, 141b, 141c and 141d. For example, the silicide layer 143b is in direct contact with the native oxide layers 139b and 139c, and the nitride spacers 141b and 141c, as shown in FIG. 16 in accordance with some embodiments.

Next, an upper capacitor contact material 145 is formed over the structure of FIG. 15, as shown in FIG. 17 in accordance with some embodiments. The respective step is illustrated as the step S21 in the method 10 shown in FIG. 3. In some embodiments, the remaining portions of the openings 120 (see FIG. 15) are filled by the upper capacitor contact material 145. In some embodiments, the upper capacitor contact material 145 includes a conductive material, such as copper (Cu), tungsten (W), aluminum (Al), titanium (Ti), tantalum (Ta), gold (Au), silver (Ag). The upper capacitor contact material 145 may be formed by a deposition process, such as a CVD process, a PVD process, a sputtering process, a plating process, or another suitable process.

Subsequently, an etching process is performed to form capacitor openings 148, as shown in FIG. 18 in accordance with some embodiments. In some embodiments, the remaining portions of the lower capacitor contact material 145 are separated from each other by the capacitor openings 148, and upper capacitor contacts 145a, 145b and 145c are obtained. In some embodiments, the lower capacitor contact material 145, the nitride spacers 141a, 141b, 141c, 141d, the native oxide layers 139a, 139b, 139c, 139d, the nitride spacers 129a, 129b, 131a, 131b, the native oxide layers 127a, 127b, 127c, 127d, the oxide spacers 125a, 125b, 125c, 125d, the native oxide layers 123a, 123b, 123c, 123d, the nitride spacers 121a, 121b, 121c, 121d, and the bit line mask layers 113a, 113b are partially removed to form the capacitor openings 148. In some embodiments, the etching process includes a wet etching process, a dry etching process, or a combination thereof. The respective step is illustrated as the step S23 in the method 10 shown in FIG. 3.

Then, an etching process is performed to remove the oxide spacers 125a, 125b, 125c, 125d and the native oxide layers 123a, 123b, 123c, 123d, 127a, 127b, 127c and 127d through the capacitor openings 148, such that gaps 150a, 150b, 150c and 150d are formed, as shown in FIG. 19 in accordance with some embodiments. In some embodiments, the native oxide layer 139a and 139c are partially removed by the etching process, such that a gap 152a is formed over the remaining portion of the native oxide layer 139a', and a gap 152b is formed over the remaining portion of the native oxide layer 139c'. In some embodiments, the gaps 150a, 150b, 150c, 150d, 152a, and 152b are formed by a dry etching process. In some embodiments, hydrofluoric acid (HF) and ammonia (NH₃) are used as the etching gases during the etching process.

Next, a post-etch cleaning process is performed to remove the remaining portions of the native oxide layers 139a' and 139c', such that gaps 152a' and 152b' are obtained, as shown in FIG. 20 in accordance with some embodiments. In some embodiments, the semiconductor substrate 101 are partially exposed by the gaps 150a, 150b, 150c and 150d. In some embodiments, the silicide layer 143a is partially exposed by the gap 152a', and the silicide layer 143b is partially exposed by the gap 152b'. In some embodiments, diluted hydrofluoric acid (DHF) is used as an etchant during the post-etch cleaning process. The respective step is illustrated as the step S25 in the method 10 shown in FIG. 3.

Subsequently, an oxidation process is performed to form oxide liners 155a, 155b, 155c, 155d, 155e, 155f, 155g and 155h in the gaps 150a, 150b, 150c, 150d, 152a' and 152b', as shown in FIG. 21 in accordance with some embodiments. In some embodiments, the oxide liners 155a and 155b are formed in the gap 150a and separated from each other by a gap 158a, and the oxide liner 155b extends to fill the gap 152a'. In some embodiments, the oxide liners 155c and 155d are formed in the gap 150b and separated from each other by a gap 158b. In some embodiments, the oxide liners 155e and 155f are formed in the gap 150c and separated from each other by a gap 158c, and the oxide liner 155e extends to fill the gap 152b'. In some embodiments, the oxide liners 155g and 155h are formed in the gap 150d and separated from each other by a gap 158d.

In some embodiments, the oxidation process for forming the oxide liners 155a, 155b, 155c, 155d, 155e, 155f, 155g and 155h is also referred to as $O_2$ plasma ashing process. During the oxidation process, the nitride spacers 121a, 121b, 121c, 121d, 129a, 129b, 131a, 131b, 141a, and 141c are oxidized, in accordance with some embodiments. The respective step is illustrated as the step S27 in the method 10 shown in FIG. 3.

Then, referring back to FIGS. 1 and 2, the capacitors 167a and 167b are formed in the capacitor openings 148, in accordance with some embodiments. In some embodiments, the gaps 158a and 158b are sealed by the capacitor 167a to form air gaps 160a and 160b, and the gaps 158c and 158d are sealed by the capacitor 167b to form air gaps 160c and 160d. The respective step is illustrated as the step S29 in the method 10 shown in FIG. 3.

As mentioned above, the capacitor 167a includes a bottom electrode 161a, a top electrode 165a, and a capacitor dielectric layer 163a sandwiched between the bottom electrode 161a and the top electrode 165a, and the capacitor 167b includes a bottom electrode 161b, a top electrode 165b, and a capacitor dielectric layer 163b sandwiched between the bottom electrode 161b and the top electrode 165b. The formation of the capacitors 167a and 167b may include sequentially depositing a conductive material, a dielectric material and another conductive material in the capacitor openings 148 (see FIG. 21) and extending over the upper capacitor contacts 145a, 145b and 145c, and performing a planarization process (e.g., a chemical mechanical polishing (CMP) process) to remove excess portions of the two conductive materials and the dielectric material. In some embodiments, the bottom electrodes 161a and 161b include titanium nitride (TiN), the capacitor dielectric layers 163a and 163b include a dielectric material, such as silicon dioxide ($SiO_2$), hafnium dioxide ($HfO_2$), aluminum oxide ($Al_2O_3$), zirconium dioxide ($ZrO_2$), or a combination thereof, and the top electrodes 165a and 165b include titanium nitride (TiN), low-stress silicon-germanium (SiGe), or a combination thereof.

After the capacitors 167a and 167b are formed, the memory device 100 with the air gaps 160a, 160b, 160c and 160d is obtained. In some embodiments, the memory device 100 is part of a dynamic random access memory (DRAM).

Embodiments of a memory device with an air gap and method for preparing the same are provided in the disclosure. In some embodiments, the memory device includes a bit line structure (e.g., the bit line structure 112b) and a lower capacitor contact (e.g., the lower capacitor contact 137b) disposed over a semiconductor substrate (e.g., the semiconductor substrate 101). The memory device also includes a first nitride spacer (e.g., the nitride spacer 121c) and a second nitride spacer (e.g., the nitride spacer 131a) disposed between the bit line structure and the lower capacitor contact. In some embodiments, the memory device includes a first oxide liner (e.g., the oxide liner 155f) and a second oxide liner (e.g., the oxide liner 155e) disposed between the first nitride spacer and the second nitride spacer, and an air gap (e.g., the air gap 160c) is between the first oxide liner and the second oxide liner. The air gap may reduce parasitic capacitance and correspondingly improve device performance (e.g., by reducing signal noise). In addition, the first oxide liner and the second oxide liner help to prevent the first nitride spacer and the second nitride spacer from being etched through during the formation of the air gap. As a result, the short issue from the bit line structure to the lower capacitor contact can be prevented.

In one embodiment of the present disclosure, a memory device is provided. The memory device includes a bit line structure disposed over a semiconductor substrate, and a lower capacitor contact disposed over the semiconductor substrate and adjacent to the bit line structure. The memory device also includes a first nitride spacer and a second nitride spacer disposed between the bit line structure and the lower capacitor contact. The memory device further includes a capacitor disposed over the first nitride spacer and the second nitride spacer. In addition, the memory device includes a first oxide liner and a second oxide liner disposed between the first nitride spacer and the second nitride spacer. An air gap is between the first oxide liner and the second oxide liner.

In another embodiment of the present disclosure, a memory device is provided. The memory device includes a bit line structure and a lower capacitor contact disposed over a semiconductor substrate. The lower capacitor contact extends into the semiconductor substrate. The memory device also includes a first nitride spacer and a second nitride spacer disposed over the semiconductor substrate and between the bit line structure and the lower capacitor contact. The first nitride spacer is in direct contact with the bit line structure, and the second nitride spacer is in direct contact with the lower capacitor contact. The memory device further includes a first oxide liner and a second oxide liner disposed between the first nitride spacer and the second nitride spacer. The first oxide liner is in direct contact with the first nitride spacer, and the second oxide liner is in direct contact with the second nitride spacer. The first oxide liner is separated from the second oxide liner by an air gap.

In yet another embodiment of the present disclosure, a method for preparing a memory device is provided. The method includes forming a bit line structure over a semiconductor substrate, and forming a first nitride spacer, a second nitride spacer, and a first oxide spacer on a sidewall of the bit line structure. The first nitride spacer is in direct contact with the bit line structure, and the first oxide spacer is between the first nitride spacer and the second nitride spacer. The method also includes forming a lower capacitor contact adjacent to the second nitride spacer, and forming an upper capacitor contact material over the lower capacitor contact. The method further includes etching the upper capacitor contact material, the first nitride spacer, the second nitride spacer, and the first oxide spacer to form a capacitor opening, and removing the first oxide spacer through the capacitor opening to form a first gap between the first nitride spacer and the second nitride spacer. In addition, the method includes performing an oxidation process to form a first oxide liner and a second oxide liner in the first gap, and forming a capacitor in the capacitor opening to seal the first gap, such that an air gap is enclosed by the capacitor, the first oxide liner, the second oxide liner, and the semiconductor substrate.

The embodiments of the present disclosure have some advantageous features. By forming oxide liners between nitride spacers, and forming air gaps between the oxide liners, the parasitic capacitance can be reduced while preventing the nitride spacers from being etched through. As a result, the short issue from the bit line structures to the capacitor contacts can be prevented, and the overall device performance can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A memory device, comprising:
   a bit line structure disposed over a semiconductor substrate;
   a lower capacitor contact disposed over the semiconductor substrate and adjacent to the bit line structure;
   a first nitride spacer and a second nitride spacer disposed between the bit line structure and the lower capacitor contact;
   a capacitor disposed over the first nitride spacer and the second nitride spacer; and
   a first oxide liner and a second oxide liner disposed between the first nitride spacer and the second nitride spacer, wherein an air gap is between the first oxide liner and the second oxide liner;
   wherein the first oxide liner is in direct contact with the first nitride spacer, and the second oxide liner is in direct contact with the second nitride spacer;
   wherein the first oxide liner further extends between the first nitride spacer and the capacitor, and the second oxide liner further extends between the second nitride spacer and the capacitor.

2. The memory device of claim 1, wherein the first oxide liner is separated from the second oxide liner.

3. The memory device of claim 1, wherein the air gap is enclosed by the semiconductor substrate, the first oxide liner, the second oxide liner, and the capacitor.

4. The memory device of claim 1, wherein the first nitride spacer is separated from the air gap by the first oxide liner, and the second nitride spacer is separated from the air gap by the second oxide liner.

5. The memory device of claim 1, further comprising:

an upper capacitor contact disposed over the lower capacitor contact; and a third nitride spacer disposed between the bit line structure and the upper capacitor contact, wherein the second nitride spacer is disposed between the first nitride spacer and the third nitride spacer, and the third nitride spacer is in direct contact with the upper capacitor contact.

6. The memory device of claim 5, wherein the second oxide liner further extends between the second nitride spacer and the third nitride spacer.

7. The memory device of claim 5, wherein the second oxide liner further extends between the third nitride spacer and the capacitor.

8. The memory device of claim 5, wherein the second oxide liner further extends between the third nitride spacer and the lower capacitor contact.

9. The memory device of claim 5, further comprising:

a silicide layer disposed between the lower capacitor contact and the upper capacitor contact, wherein the second oxide liner is in direct contact with the silicide layer.

10. A memory device, comprising:

a bit line structure and a lower capacitor contact disposed over a semiconductor substrate, wherein the lower capacitor contact extends into the semiconductor substrate;

a first nitride spacer and a second nitride spacer disposed over the semiconductor substrate and between the bit line structure and the lower capacitor contact, wherein the first nitride spacer is in direct contact with the bit line structure, and the second nitride spacer is in direct contact with the lower capacitor contact; and a first oxide liner and a second oxide liner disposed between the first nitride spacer and the second nitride spacer, wherein the first oxide liner is in direct contact with the first nitride spacer, and the second oxide liner is in direct contact with the second nitride spacer, wherein the first oxide liner is separated from the second oxide liner by an air gap;

wherein the first oxide liner and the second oxide liner are in direct contact with the semiconductor substrate.

11. The memory device of claim 10, further comprising:

an upper capacitor contact disposed over the lower capacitor contact; and a third nitride spacer disposed between the second nitride spacer and the upper capacitor contact, wherein the third nitride spacer is in direct contact with the upper capacitor contact.

12. The memory device of claim 11, wherein the third nitride spacer is separated from the second nitride spacer by the second oxide liner.

13. The memory device of claim 11, further comprising:

a silicide layer disposed between the lower capacitor contact and the upper capacitor contact.

14. The memory device of claim 13, wherein the silicide layer is in direct contact with the third nitride spacer and the second oxide liner.

15. The memory device of claim 11, further comprising:

a capacitor disposed over the first nitride spacer, the second nitride spacer, and the third nitride spacer, wherein the air gap is sealed by the capacitor.

16. The memory device of claim 15, wherein the first oxide liner and the second oxide liner are in direct contact with the capacitor.

17. The memory device of claim 15, wherein the first nitride spacer is separated from the capacitor by the first oxide liner.

18. The memory device of claim 15, wherein the second nitride spacer and the third nitride spacer are separated from the capacitor by the second oxide liner.

* * * * *